United States Patent
Kobayashi

(10) Patent No.: US 10,914,577 B2
(45) Date of Patent: Feb. 9, 2021

(54) POSITION DETECTING APPARATUS, LENS APPARATUS, POSITION DETECTING METHOD, AND STORAGE MEDIUM

(71) Applicant: CANON KABUSHIKI KAISHA, Tokyo (JP)

(72) Inventor: Koya Kobayashi, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/664,081

(22) Filed: Oct. 25, 2019

(65) Prior Publication Data
US 2020/0132442 A1 Apr. 30, 2020

(30) Foreign Application Priority Data
Oct. 29, 2018 (JP) ................. 2018-203152

(51) Int. Cl.
| | | |
|---|---|---|
| G01B 11/25 | (2006.01) | |
| G02B 7/10 | (2021.01) | |
| H04N 5/232 | (2006.01) | |
| G03B 17/02 | (2021.01) | |
| G01D 5/347 | (2006.01) | |
| G03F 7/20 | (2006.01) | |

(52) U.S. Cl.
CPC ..... *G01B 11/2522* (2013.01); *G01D 5/34776* (2013.01); *G02B 7/102* (2013.01); *G03B 17/02* (2013.01); *H04N 5/23287* (2013.01); *G03B 2217/002* (2013.01); *G03F 7/70775* (2013.01)

(58) Field of Classification Search
CPC .......... G01B 11/2522; G01D 5/24476; G01D 5/34776; G01D 5/34792; G02B 7/08; G02B 7/102; G03B 17/02; G03B 2217/002; G03F 7/70775; H04N 5/23287
USPC ....................................... 356/614
See application file for complete search history.

(56) References Cited

U.S. PATENT DOCUMENTS

2010/0031097 A1* 2/2010 Seo ................... G01D 5/24495
714/709

FOREIGN PATENT DOCUMENTS

| JP | 2002372437 A | 12/2002 |
|---|---|---|
| JP | 4581953 B2 | 11/2010 |

* cited by examiner

*Primary Examiner* — Colin W Kreutzer
(74) *Attorney, Agent, or Firm* — Rossi, Kimms & McDowell LLP

(57) ABSTRACT

A position detecting apparatus includes a signal detecting unit that detects a plurality of periodic signals, a correction unit configured to correct the plurality of periodic signals using a correction value to generate a plurality of correction signals, a first calculating unit configured to generate a plurality of displacement signals based on the plurality of correction signals and to calculate the position based on the plurality of displacement signals, a second calculating unit configured to calculate a reliability based on the plurality of displacement signals, and a correction value adjusting unit configured to adjust the correction value based on the reliability. The second calculating unit calculates a first reliability corresponding to a first correction value and a second reliability corresponding to a second correction value, and changes the first correction value to the second correction value when the second reliability is higher than the first reliability.

17 Claims, 19 Drawing Sheets

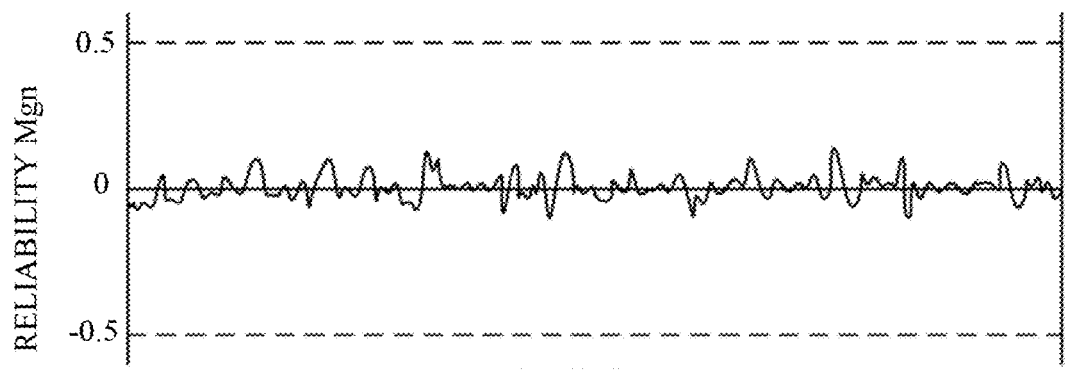
FIG. 9A    SCALE'S OVERALL LENGTH Lmax
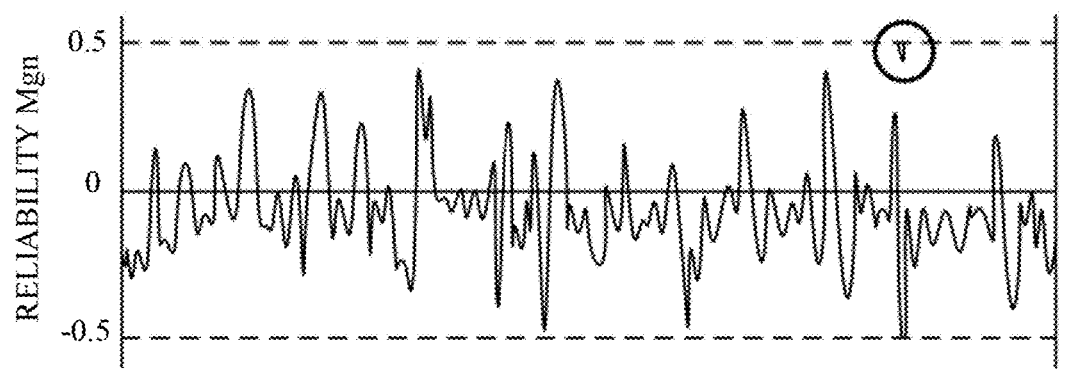
FIG. 9B    SCALE'S OVERALL LENGTH Lmax

POSITION DETECTING APPARATUS, LENS APPARATUS, POSITION DETECTING METHOD, AND STORAGE MEDIUM

BACKGROUND OF THE INVENTION

Field of the Invention

The present invention relates to a position detecting apparatus that detects a position of an object.

Description of the Related Art

A conventional absolute encoder (position detecting apparatus) can detect an (absolute) position of an object. The absolute encoder converts, for example, a two-phase sine wave signal that changes with the position of the object acquired from a sensor into an absolute position signal. However, as the amplitude or offset of the two-phase sine wave signal varies, the reliability of the absolute position signal lowers.

Japanese Patent Laid-Open No. 2002-372437 discloses an offset correcting circuit that corrects an encoder offset by feeding back an offset error to a two-phase sine wave signal. Japanese Patent No. 4581953 discloses a correction circuit of an encoder output signal for calculating the amplitude and offset based on a peak value of a signal and for correct the amplitude and offset.

However, the offset correcting circuit disclosed in Japanese Patent Laid-Open No. 2002-372437 needs to add a circuit for feedback, and increases the cost. On the other hand, the correction circuit for the encoder output signal disclosed in Japanese Patent No. 4581953 corrects a signal using a correction value calculated based on the peak value of the signal, and thus needs no feedback. However, the correction circuit disclosed in Japanese Patent No. 4581953 needs to change the position of the object in order to obtain the peak value of the signal. Hence, it is difficult to calculate the correction value during normal use or while the position of the object cannot be changed, and the reliability (accuracy) of the absolute position signal cannot always be maintained.

SUMMARY OF THE INVENTION

The present invention provides a position detecting apparatus, a lens apparatus, a position detecting method, and a storage medium, each of which can inexpensively maintain a detection accuracy of a position of an object.

A position detecting apparatus according to one aspect of the present invention includes a signal detecting unit configured to detect a plurality of periodic signals relating to a position of an object, a correction unit configured to correct the plurality of periodic signals using a correction value to generate a plurality of correction signals, a first calculating unit configured to generate a plurality of displacement signals based on the plurality of correction signals and to calculate the position based on the plurality of displacement signals, a second calculating unit configured to calculate a reliability based on the plurality of displacement signals; and a correction value adjusting unit configured to adjust the correction value based on the reliability. The second calculating unit calculates a first reliability corresponding to a first correction value and a second reliability corresponding to a second correction value. The correction value adjusting unit changes the first correction value to the second correction value when the second reliability is higher than the first reliability.

A lens apparatus according to another aspect of the present invention includes an optical element, and the above position detecting apparatus configured to detect a position of the optical element.

Further features of the present invention will become apparent from the following description of exemplary embodiments with reference to the attached drawings.

BRIEF DESCRIPTION OF THE DRAWINGS

FIGS. 9A and 9B are graphs showing the reliability according to the first embodiment.

DESCRIPTION OF THE EMBODIMENTS

Referring now to the accompanying drawings, a detailed description will be given of embodiments according to the present invention.

First Embodiment

Figure 1:
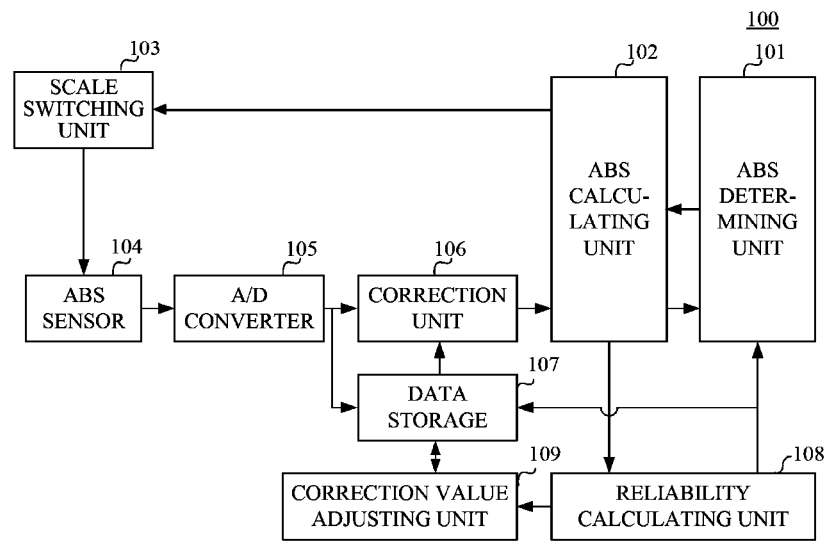
FIG. 1 is a block diagram of a position detecting apparatus according to a first embodiment.

Referring now to FIGS. 1 to 15, a description will be given of a position detecting apparatus according to a first embodiment of the present invention. FIG. 1 is a block diagram of a position detecting apparatus 100 according to this embodiment. An ABS calculating unit (first calculating unit) 102 calculates a position Pabs as an absolute position of a movable element (movable member or object) relative to the fixed element (fixed member) based on a signal output from the ABS sensor (signal detecting unit) 104. A detailed description of a method for calculating the absolute position Pabs will be given later.

A scale switching unit 103 switches two types of signal outputs based on two types of track patterns and sequentially outputs them from an ABS sensor 104. The ABS sensor 104 is a detection sensor that outputs a signal corresponding to the absolute position of the movable element relative to the fixed element. Herein, ABS stands for an absolute position. An internal configuration and output signal of the ABS sensor 104 will be described later. An A/D converter 105 converts an analog signal output from the ABS sensor 104 into a digital signal. A correction unit 106 corrects a signal converted into the digital signal by the A/D converter 105, based on a correction value stored in a data storage 107. A detailed description of the correction by the correction unit 106 and the correction value will be given later. A reliability calculating unit (second calculating unit) 108 calculates a reliability Mgn that is the reliability of the absolute position Pabs calculated by the ABS calculating unit 102. The reliability will be described in detail later. The data storage 107 is a nonvolatile memory, such as a EEPROM, which stores and saves the signal converted into the digital signal by the A/D converter 105, the correction value, and the reliability Mgn calculated by the reliability calculating unit 108.

The ABS determining unit (position determining unit) 101 requests the ABS calculating unit 102 to calculate the absolute position Pabs, and determines the absolute position Pabs calculated by the ABS calculating unit 102 based on the reliability Mgn calculated by the reliability calculating unit 108. The correction value adjusting unit 109 adjusts the correction value stored in the data storage 107, based on the reliability Mgn calculated by the reliability calculating unit 108. The correction value adjustment will be described in detail later. In this embodiment, the ABS determining unit 101, the ABS calculating unit 102, the correction unit 106, the reliability calculating unit 108, and the correction value adjusting unit 109 can constitute a single CPU or a plurality of CPUs.

Figure 2:
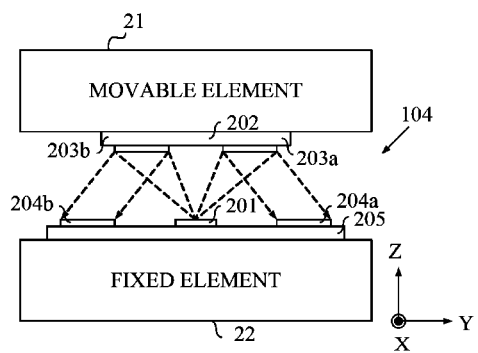
FIG. 2 is a sectional view of an ABS sensor according to the first embodiment.

Next follows a description will be given of the internal configuration and output signal of the ABS sensor 104. FIG. 2 is a sectional view of the ABS sensor 104. In FIG. 2, a movable element 21 is movable member that is movable in a direction perpendicular to the paper surface (X-axis direction). A fixed element 22 is an element that serves as a reference for the absolute position of the movable element 21. A light source 201 includes a light emitting unit, such as an LED. A scale unit 202 has two track patterns 203a and 203b that are equally spaced with different numbers of slits over the overall length. Light receiving units 204a and 204b receive light from the light source 201 reflected by the track patterns 203a and 203b, respectively, and are configured by, for example, a photodiode array.

A signal processing circuit 205 processes the signals received by the light receiving units 204a and 204b, and outputs one of the track patterns 203a and 203b in accordance with the switching signal of the scale switching unit 103. In this embodiment, the movable element 21 has the scale unit 202, and the fixed element 22 has the light source 201 and the light receiving units 204a and 204b, but the present invention is not limited to this embodiment. For example, the scale unit 202 may be provided onto the fixed element 22, and the light source 201 and the light receiving units 204a and 204b may be provided onto the movable element 21. This also applies to the second embodiment and the third embodiment described later.

Figure 3:
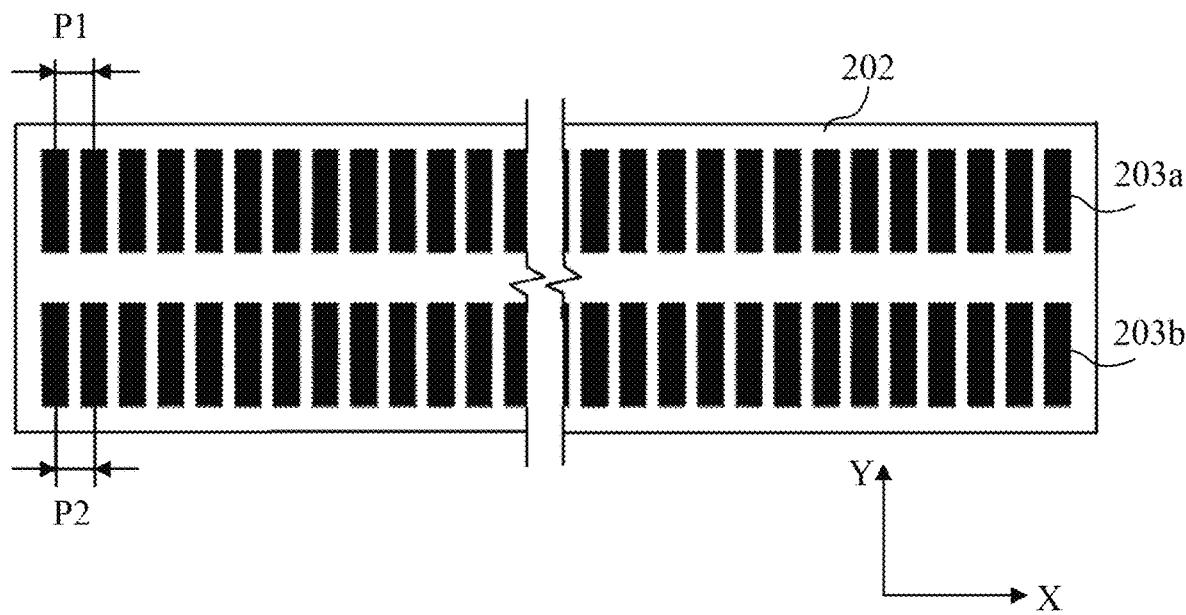
FIG. 3 is a plan view of a scale portion according to the first embodiment.

FIG. 3 is a plan view of the scale unit 202 according to this embodiment. Although FIG. 3 illustrates a reflective slit pattern as an example, another configuration, such as a transmission type slit pattern, may be employed. The scale unit 202 includes two track patterns or a track pattern (first track pattern) 203a and a track pattern (second track pattern) 203b. Reflectors in the track pattern 203a are arranged at regular intervals P1. Reflectors in the track pattern 203b are arranged at regular intervals P2. When light emitted from the light source 201 enters the reflectors in the track patterns 203a and 203b, the light is reflected toward the light receiving units 204a and 204b, respectively. In this embodiment, the interval P1 is configured so that there are 40 reflectors for the overall length of the scale or 40 periods for the overall length Lmax. The interval P2 is configured such that there are 39 reflectors for the overall length of the scale or 39 Periods for the overall length Lmax.

Figure 4:
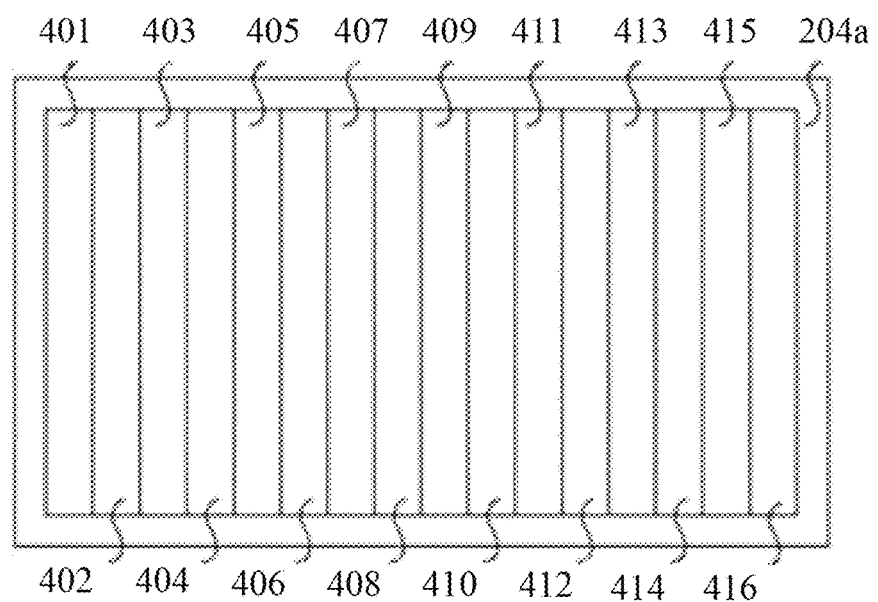
FIG. 4 is a plan view of a light receiving unit according to the first embodiment.

FIG. 4 is a plan view of the light receiving unit 204a. The light receiving unit 204b is configured similar to the light receiving unit 204a. In the light receiving unit 204a, 16 photodiodes 401 to 416 are arranged at regular intervals in the horizontal direction. The photodiodes 401, 405, 409, and 413 are electrically connected, and this set will be referred to as a phase. A set of the photodiodes 402, 406, 410, and 414 will be referred to as a b-phase. Similarly, a set of photodiodes 403, 407, 411, and 415 will be referred to as a c-phase, and a set of photodiodes 404, 408, 412, and 416 will be referred to as a d-phase.

A description in this embodiment premises that an interval of the four photodiodes in the light receiving unit 204a (such as an interval between the photodiodes 401 to 404) is twice as long as the interval P1 between the reflectors of the track pattern 203a. Herein, since a double distance from the light source 201 to the reflector of the track pattern 203a is equal to a distance from the light source 201 to the light receiving unit 204a, the width of the reflected light received by the light receiving unit 204a is twice as wide as the width of the reflector. Thus, the interval of the four photodiodes in the light receiving unit 204a (such as the interval between the photodiodes 401 to 404) corresponds to one period of the pattern of the track pattern 203a.

When the light from the light source 201 reflected by the track pattern 203a is received by the light receiving unit 204a, each of the a-phase, b-phase, c-phase, and d-phase photodiode groups outputs the current corresponding to the received light amount. As the scale portion 202 moves in the X-axis direction, each of the a-phase, b-phase, c-phase, and d-phase photodiode groups output the fluctuating currents such that there is a phase relationship of 90° between the b-phase and the a-phase, a phase relationship of 180° between the c-phase and the a-phase, and a phase relationship of 270° between the d-phase and the a-phase.

The signal processing circuit 205 converts the output current into a voltage with a current-voltage converter. Then, the signal processing circuit 205 calculates each of a differential component between the a-phase and the c-phase and a differential component between the b-phase and the d-phase, using a differential amplifier. Next, the signal processing circuit 205 generates an first a-phase displacement signal S1rA as a-phase displacement signal and a first b-phase displacement signal S1rB as a b-phase displacement signal of the track pattern 203a which shift in phase by 90° based on the differential component between the a-phase and the c-phase and the differential component between the b-phase and the d-phase.

In the similar manner, the light receiving unit 204b generates the second a-phase displacement signal S2rA, which is the a-phase displacement signal of the track pattern 203b, and the second b-phase displacement signal S2rB, which is the b-phase displacement signal. The signal processing circuit 205 outputs the first a-phase displacement signal S1rA and the first b-phase displacement signal S1rB or the second a-phase displacement signal S2rA and the second b-phase displacement signal S2rB in accordance with the switching signal from the scale switching unit 103. As described above, the ABS sensor 104 outputs the first a-phase displacement signal S1rA and the first b-phase displacement signal S1rB, or the second a-phase displacement signal S2rA and the second b-phase displacement signal S2rB in accordance with the switching signal from the scale switching unit 103.

Figure 5:
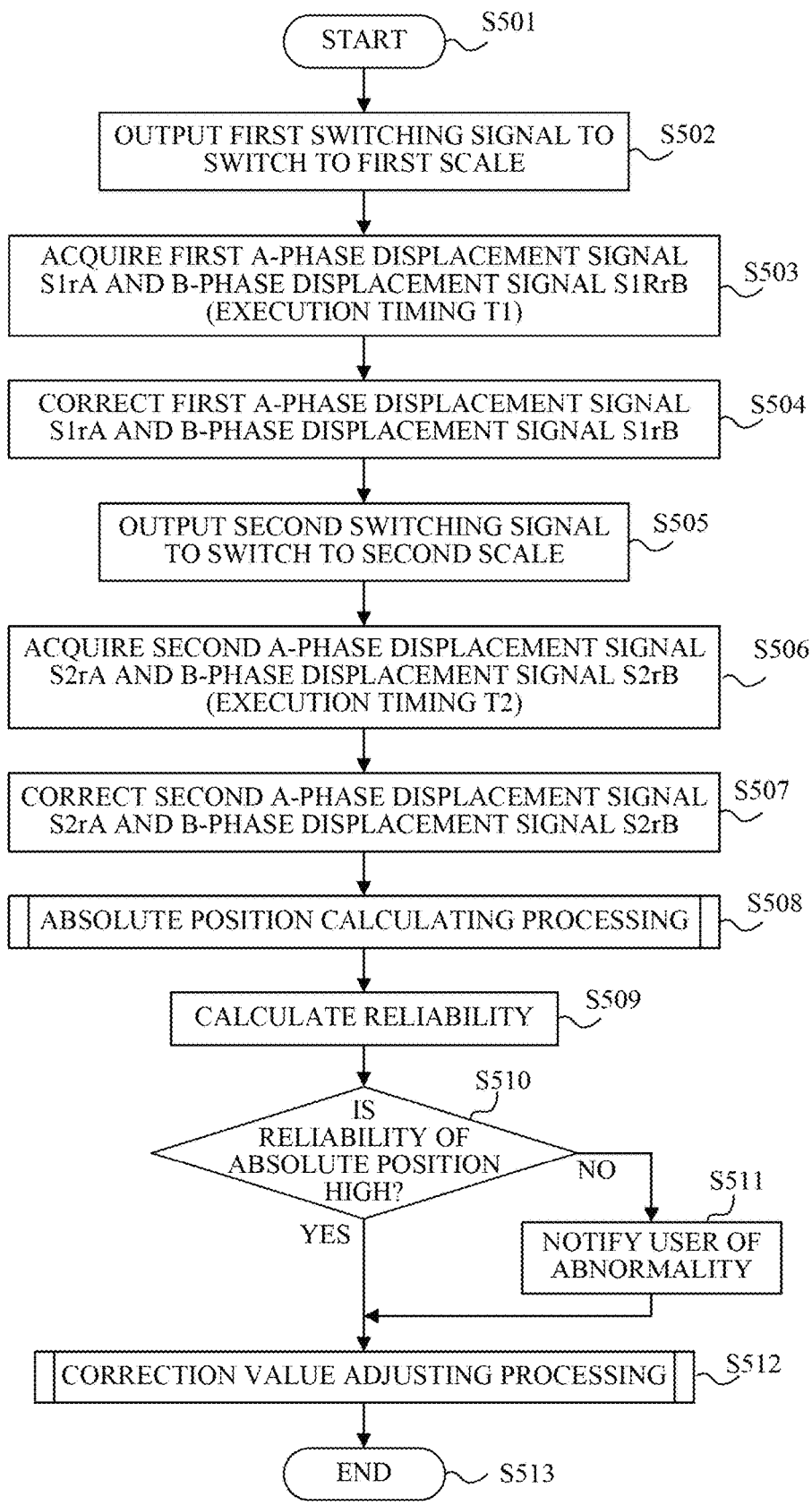
FIG. 5 is a flowchart showing an operation of the position detecting apparatus according to the first embodiment.

Next follows a description of an operation of the position detecting apparatus 100 according to this embodiment. FIG. 5 is a flowchart showing the operation of the position detecting apparatus 100. Each step in FIG. 5 is executed by each unit of the position detecting apparatus 100.

First, in the step S501, this flow starts. This flow (absolute position Pabs determining processing) is started when the ABS determining unit 101 requests the ABS calculating unit 102 to calculate the absolute position Pabs. Next, in the step S502, the ABS calculating unit 102 outputs a first switching signal for switching to the first scale (track pattern 203a) to the scale switching unit 103. In response to the first switching signal, the scale switching unit 103 instructs the ABS sensor 104 to output the signal of the track pattern 203a. The ABS sensor 104 outputs the first a-phase displacement signal S1rA and the first b-phase displacement signal S1rB. The first a-phase displacement signal S1rA and the first b-phase displacement signal S1rB are converted into digital signals by the A/D converter 105 and output to the ABS calculating unit 102.

Next, in the step S503, the correction unit 106 acquires the signal level V1rA of the first a-phase displacement signal S1rA and the signal level V1rB of the first b-phase displacement signal S1rB at the execution timing T1 of the step S503 output from the A/D converter 105. At the same time, the data storage 107 stores the signal level V1rA of the first a-phase displacement signal S1rA and the signal level V1rB of the first b-phase displacement signal S1rB.

Next, in the step S504, the correction unit 106 corrects the signal level V1rA of the first a-phase displacement signal S1rA and the signal level V1rB of the first b-phase displacement signal S1rB at the execution timing T1. Herein, the first a-phase displacement signal S1rA and the first b-phase displacement signal S1rB may have mutually different amplitudes and offsets. Hence, if the absolute position is calculated without correcting the signals, the calculated absolute position Pabs contains an error. Thus, a signal correction is required.

In this embodiment, as described above, the interval of the four photodiodes in the light receiving unit 204a (such as the interval between the photodiodes 401 to 404) is twice as long as the interval P1 between the reflectors in the track pattern 203a. Accordingly, the first a-phase displacement signal S1rA and the first b-phase displacement signal S1rB are respectively expressed by the following expressions (1) and (2).

$$S1rA: a1 \times \cos\theta + s1 \quad (1)$$

$$S1rB: a2 \times \sin\theta + s2 \quad (2)$$

In the expressions (1) and (2), a1 and s1 are the amplitude and offset of the first a-phase displacement signal S1rA, a2 and s2 are the amplitude and offset of the first b-phase displacement signal S1rB, and θ is the phase of the signal. The maximum value of the first a-phase displacement signal S1rA is s1+a1, the minimum value is s1-a1, the signal amplitude is a1, and the average value is s1. Similarly, the maximum value of the first b-phase displacement signal S1rB is s2+a2, the minimum value is s2-a2, the signal amplitude is a2, and the average value is s2. a1 and a2 are an amplitude correction value A1 of the first a-phase displacement signal S1rA and an amplitude correction value A2 of the first b-phase displacement signal S1rB, respectively, and stored in the data storage 107. Further, s1 and s2 are an offset correction value S1 of the first a-phase displacement signal S1rA and an offset correction value S2 of the first b-phase displacement signal S1rB, respectively, and stored in the data storage 107.

The first a-phase displacement signal S1rA and the first b-phase displacement signal S1rB represented by the expressions (1) and (2) are corrected with the correction values A1, A2, S1, and S2. Corrected first a-phase displacement signal S1cA and first b-phase displacement signal S1cB are respectively expressed by the following expressions (3) and (4).

$$S1cA: \{(a1 \times \cos\theta + s1) - s1\} \times a2 = a1 \times a2 \times \cos\theta \quad (3)$$

$$S1cB: \{(a2 \times \sin\theta + s2) - s2\} \times a1 = a1 \times a2 \times \sin\theta \quad (4)$$

As a result, the offsets s1 and s2 of the first a-phase displacement signal S1rA and the first b-phase displacement signal S1rB are eliminated, and the first a-phase displacement signal S1cA and the first b-phase displacement signal S1cB having the same amplitudes are obtained. As described above, the first a-phase displacement signal S1rA and the first b-phase displacement signal S1rB are corrected in the step S504, and the flow proceeds to the step S505.

In the step S505, the ABS calculating unit 102 outputs a second switching signal for switching to the second scale (track pattern 203b) to the scale switching unit 103. In response to the second switching signal, the scale switching unit 103 instructs the ABS sensor 104 to output the signal of the track pattern 203b. The ABS sensor 104 outputs a second a-phase displacement signal S2rA and a second b-phase displacement signal S2rB. The second a-phase displacement signal S2rA and the second b-phase displacement signal S2rB are converted into digital signals by the A/D converter 105 and output to the correction unit 106.

Next, in the step S506, the correction unit 106 acquires the signal level V2rA of the second a-phase displacement signal S2rA and the signal level V2rB of the second b-phase displacement signal S2rB at the execution timing T2 of the step S506 output from the A/D converter 105. At the same time, the data storage 107 stores the signal level V2rA of the second a-phase displacement signal S2rA and the signal level V2rB of the second b-phase displacement signal S2rB.

Next, in the step S507, the correction unit 106 corrects the signal level V2rA of the second a-phase displacement signal S2rA and the signal level V2rB of the second b-phase displacement signal S2rB at the execution timing T2. Since the light receiving unit 204b is configured similar to the light receiving unit 204a, the interval of the four photodiodes in the light receiving unit 204b (such as the interval between the photodiodes 401 to 404) is as twice as the interval P1 between the reflectors in the track pattern 203a. The interval P1 between the reflectors in the track pattern 203a and the interval P2 between the reflectors in the second track pattern 203b are different from each other. Hence, the interval of the four photodiodes in the light receiving unit 204b (such as the interval between the photodiodes 401 to 404) is not twice as long as the interval P2 between the reflectors in the track pattern 203b. Hence, the second a-phase displacement signal S2rA and the second b-phase displacement signal S2rB have a phase relationship shifted from 90°.

The second a-phase displacement signal S2rA and the second b-phase displacement signal S2rB are respectively expressed by the following expressions (5) and (6).

$$S2rA: b1 \times \cos\theta + t1 \quad (5)$$

$$S2rB: b2 \times \sin(\theta+\alpha) + t2 \quad (6)$$

In the expressions (5) and (6), b1 and t1 are the amplitude and offset of the second a-phase displacement signal S2rA, b2 and t2 are the amplitude and offset of the second b-phase displacement signal S2rB, $\theta$ is the signal, and $\alpha$ is a shift amount of the phase. b1 and b2 are the amplitude correction value B1 of the second a-phase displacement signal S2rA and the amplitude correction value B2 of the second b-phase displacement signal S2rB, respectively, and stored in the data storage 107. t1 and t2 are the offset correction value T1 of the second a-phase displacement signal S2rA and the offset correction value T2 of the second b-phase displacement signal S2rB, respectively, and stored in the data storage 107.

The second a-phase displacement signal S2rA and the second b-phase displacement signal S2rB represented by the expressions (5) and (6) are corrected with the correction values B1, B2, T1, and T2. The corrected second a-phase displacement signal S2cA' and second b-phase displacement signal S2cB' are respectively expressed by the following expressions (7) and (8).

$$S2cA': ((b1 \times \cos\theta + t1) - t1) \times b2 = b1 \times b2 \times \cos\theta \quad (7)$$

$$S2cB': \{(b2 \times \sin(\theta+\alpha) + t2) - t2\} \times b1 = b1 \times b2 \times \sin(\theta+\alpha) \quad (8)$$

As a result, the second a-phase displacement signal S2cA' and the second b-phase displacement signal S2cB' having the same amplitudes in which the offsets t1 and t2 of the second a-phase displacement signal S2rA and the second b-phase displacement signal S2rB are eliminated.

Next follows a description of processing that sets the phase difference between the second a-phase displacement signal S2cA' and the second b-phase displacement signal S2cB' to 90° using the expressions (7) and (8). The difference and sum of the expressions (7) and (8) are respectively expressed as in the following expressions (9) and (10).

$$b1 \times b2 \times (\sin(\theta+\alpha) - \cos\theta) = b1 \times b2 \times 2 \times \sin((\alpha-90)/2) \times \cos\{\theta+(\alpha+90)/2\} \quad (9)$$

$$b1 \times b2 \times (\sin(\theta+\alpha) + \cos\theta) = b1 \times b2 \times 2 \times \cos\{(\alpha-90)/2\} \times \sin\{\theta+(\alpha+90)/2\} \quad (10)$$

From the above, the phase difference between the expressions (9) and (10) is 90°. Since the amplitudes of the expressions (9) and (10) are different from each other, the amplitude is next corrected, and the second a-phase displacement signal S2cA and the second b-phase displacement signal S2cB having the same amplitudes are calculated.

When the expression (9) is multiplied by COS $\{(\alpha-90)/2\}$ which is part of the amplitude of the expression (10) and the expression (10) is multiplied by SIN $\{(\alpha-90)/2\}$ which is part of the amplitude of the expression (9), the following expressions (11) and (12) are obtained.

$$S2cA: b1 \times b2 \times 2 \times \sin\{(\alpha-90)/2\} \times \cos\{(\alpha-90)/2\} \times \cos\{\theta+(\alpha+90)/2\} \quad (11)$$

$$S2cB: b1 \times b2 \times 2 \times \sin\{(\alpha-90)/2\} \times \cos\{(\alpha-90)/2\} \times \sin\{\theta+(\alpha+90)/2\} \quad (12)$$

As a result, the second a-phase displacement signal S2cA and the second A second b-phase displacement signal S2cB having the same amplitudes and the phase difference of 90° are obtained in which the offsets of the second a-phase displacement signal S2rA and the second b-phase displacement signal S2rB are eliminated. As described above, when the second a-phase displacement signal S2rA and the second b-phase displacement signal S2rB are corrected in the step S507, the flow proceeds to the step S508.

In the step S508, the ABS calculating unit 102 calculates the absolute position Pabs based on the first a-phase displacement signal S1cA, the first b-phase displacement signal S1cB, the second a-phase displacement signal S2cA, and the second b-phase displacement signal S2cB calculated by the correction unit 106. The absolute position calculating processing will be described in detail later. Next, in the step S509, the reliability calculating unit 108 calculates a reliability Mgn that is a parameter indicating the reliability of the absolute position Pabs calculated in the step S508. The reliability calculation will be described in detail later. The data storage 107 stores the reliability Mgn.

Next, in the step S510, the reliability calculating unit 108 determines the reliability of the absolute position Pabs calculated in the step S508 based on the reliability Mgn calculated in the step S509. If it is determined that the reliability is high, the flow proceeds to the step S512. On the other hand, if it is determined that the reliability is low, the flow proceeds to the step S511. The absolute position reliability determination will be described in detail later.

In the step S511, an abnormality notifying unit (not shown) such as an LED notifies the user of the abnormality, and flow proceeds to the step S512. In the step S512, the correction value adjusting unit 109 performs correction value adjusting processing, and proceeds to step S513. The correction value adjusting processing will be described in detail later. In the step S513, this flow ends. According to this flow, the ABS determining unit 101 determines the absolute position Pabs calculated by the ABS calculating unit 102, as the absolute position (position of the object) of the movable element 21.

Figure 6:
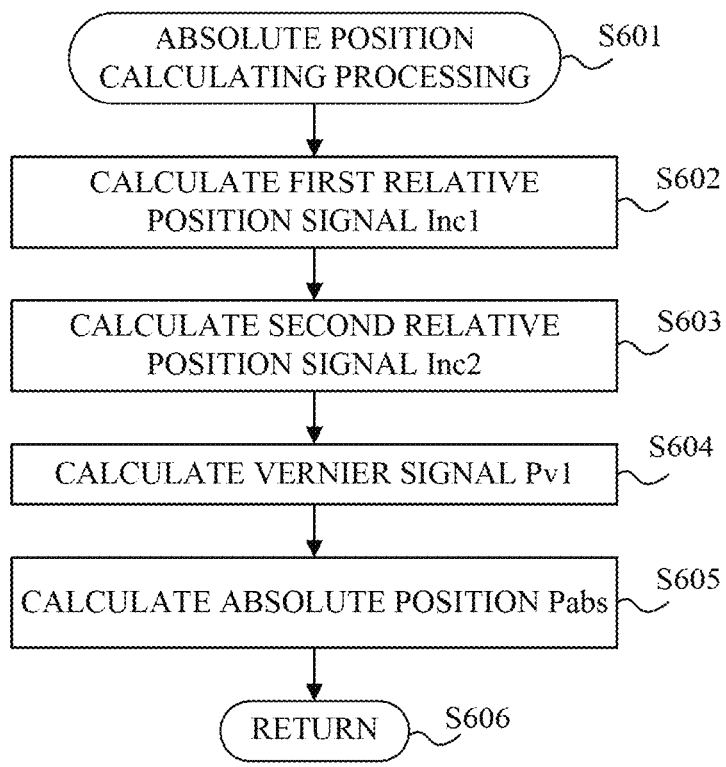
FIG. 6 is a flowchart showing absolute position calculating processing according to the first embodiment.
Figure 7A:
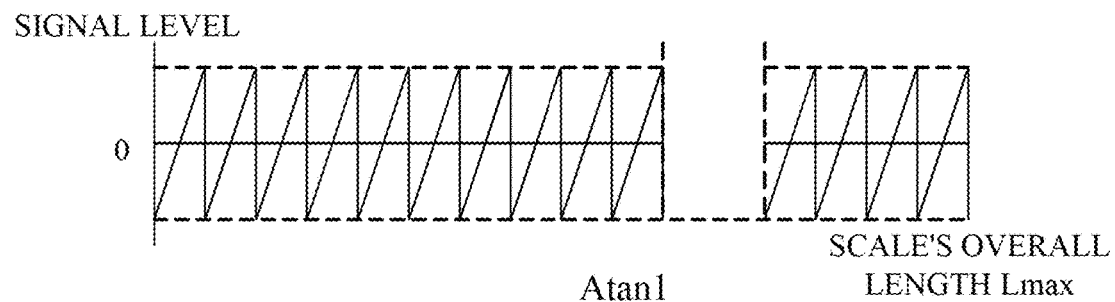
FIGS. 7A to 7D are signal graphs according to the first embodiment.
Figure 7B:
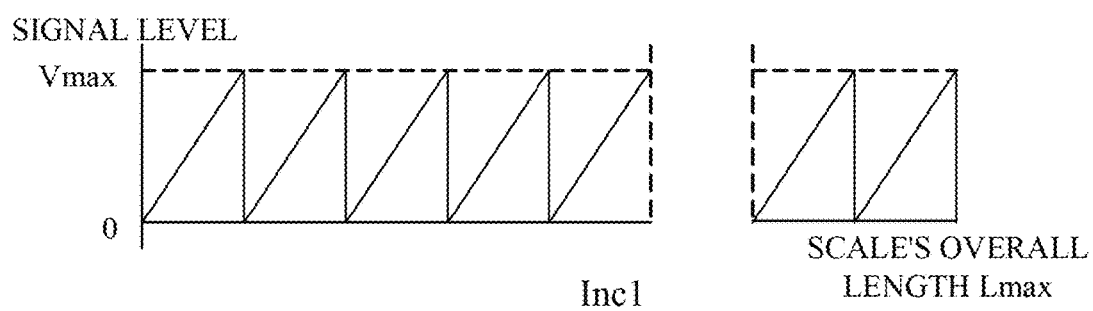
Figure 7C:
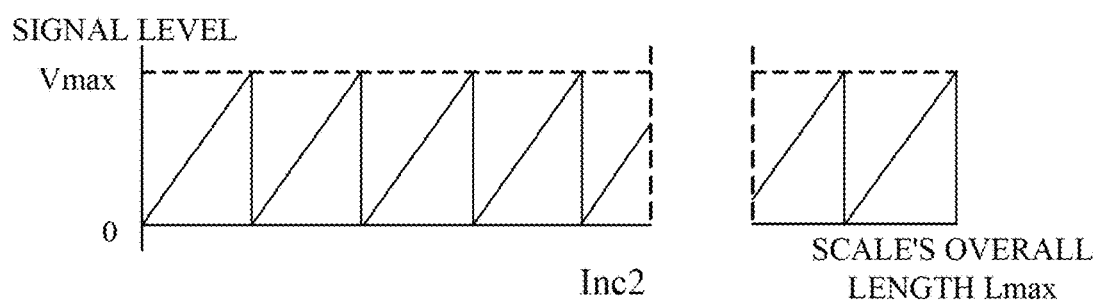
Figure 7D:
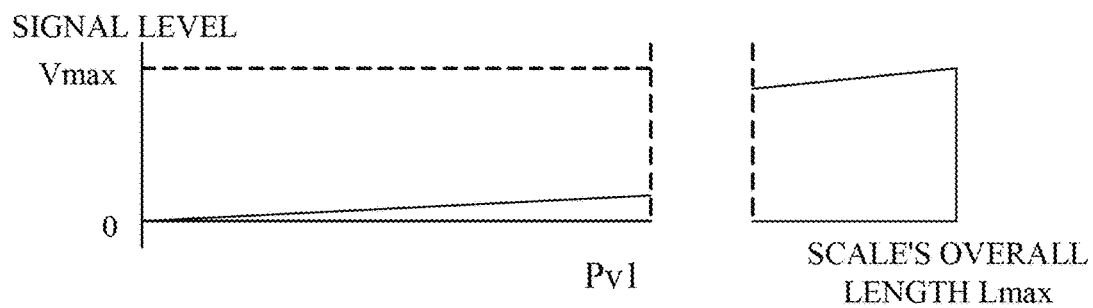

Referring now to FIGS. 6 and 7A to 7D, a description will be given of the absolute position calculating processing (step S508). FIG. 6 is a flowchart showing the absolute position calculating processing (calculation processing for the absolute position Pabs). Each step in FIG. 6 is executed by the ABS calculating unit 102. FIGS. 7A to 7D are graphs of each signal. FIG. 7A is a signal Atan1, FIG. 7B is a first relative position signal Inc1, FIG. 7C is a second relative position signal Inc2, and FIG. 7D illustrates the Vernier signal Pv1. In each of FIGS. 7A to 7D, the abscissa axis indicates the position for the overall length of the scale, and the ordinate axis indicates the signal level.

First, in the step S601, the flow starts. Next, in the step S602, the ABS calculating unit 102 calculates a first relative position signal Inc1 having an amplitude Vmax and 40 periods for the overall length of the scale as illustrated in FIG. 7B using the corrected first a-phase displacement signal S1cA and first b-phase displacement signal S1cB.

First, the ABS calculating unit 102 performs an arctangent calculation using the corrected first a-phase displacement signal S1cA and first b-phase displacement signal S1cB, and calculates the signal Atan1 illustrated in FIG. 7A. The track pattern 203a is a pattern having 40 periods for the overall length of the scale. Therefore, the signal Atan1 has 80 periods for the overall length of the scale.

Next, the ABS calculating unit 102 calculates a first relative position signal Inc1 having the amplitude Vmax and 40 periods for the overall length of the scale based on the signal Atan1. The first relative position signal Inc1 is calculated by multiplying a gain to the Atan1 signal so that the amplitude of the signal Atan1 becomes Vmax/2, by setting to 0 the signal level when the phase of the first b-phase displacement signal S1rB is 0°, and by adding Vmax/2 to the result when the phase is 180° to 360°. Thus, the first relative position signal Inc1 is a sawtooth wave having 40 periods for the overall length of the scale as illustrated in FIG. 7B. The ABS calculating unit 102 calculates the first relative position signal Inc1 that is a one-to-one correspondence with the phase of the track pattern 203a having the interval P1. As described above, in the step S602, a signal level V1inc1 of the first relative position signal Inc1 at the execution timing T1 is calculated from the first a-phase displacement signal S1cA and the first b-phase displacement signal S1cB at the execution timing T1, and the flow proceeds to the step S603.

In the step S603, the ABS calculating unit 102 performs the same calculation similar to the step S602 using the corrected second a-phase displacement signal S2cA and second b-phase displacement signal S2cB, and calculates the second relative position signal Inc2. The track pattern 203b is a pattern having 39 periods for the overall length of the scale. Thus, the second relative position signal Inc2 becomes a sawtooth wave having 39 periods for the overall length of the scale as illustrated in FIG. 7C. Hence, the ABS calculating unit 102 calculates the second relative position signal Inc2 that corresponds one-to-one to the phase of the track pattern 203b having the interval P2. As described above, in the step S603, a signal level V2inc2 of the second relative position signal Inc2 at the execution timing T2 is calculated, and the flow proceeds to the step S604.

In the step S604, the ABS calculating unit 102 calculates a Vernier signal Pv1 based on the signal level V1inc1 of the first relative position signal Inc1 at the execution timing T1 and the signal level V2inc2 of the second relative position signal Inc2 at the execution timing T2. The Vernier signal Pv1 calculated at this time is illustrated in FIG. 7D. The Vernier signal Pv1 is obtained by calculating a difference between the signal level V1inc1 of the first relative position signal Inc1 and the signal level V2inc2 of the second relative position signal Inc2, and by adding the amplitude Vmax to it when the difference is a negative value. Here, since the difference in the period is 1 for the overall length Lmax of the first relative position signal Inc1 and the second relative position signal Inc2, the Vernier signal Pv1 becomes a sawtooth wave having one period for the overall length Lmax as illustrated in FIG. 7D. When the Vernier signal Pv1 is calculated in the step S604, the flow proceeds to the step S605.

In the step S605, the ABS calculating unit 102 calculates the absolute position Pabs. A method of calculating the absolute position Pabs will be described in detail later. The first a-phase displacement signal S1rA, the first b-phase displacement signal S1rB, the second a-phase displacement signal S2rA, and the second b-phase displacement signal S2rB include error components. Hence, the first relative position signal Inc1 and the second relative position signal Inc2 calculated from these signals also contain error components. In order to correct (reduce) these error components, the ABS calculating unit 102 performs a synchronization operation between the Vernier signal Pv1 and the first relative position signal Inc1. The synchronization calculation will be described in detail later. A signal synthesized using the Vernier signal Pv1 that is a higher signal and the first relative position signal Inc1 that is a lower signal is calculated as the signal Vabs indicating the absolute position. The signal Vabs indicating the absolute position will be described in detail later.

Referring now to FIGS. 8A to 8D, a description will be given of the synchronization calculation. FIGS. 8A to 8D are graphs showing changes in the signal waveforms due to the synchronization calculation. In FIGS. 8A to 8D, the abscissa axis indicates the position in the overall length of the scale, and the ordinate axis indicates the signal level. The maximum value of the signal level is the amplitude Vmax. N1 indicates the number of periods of the region counting from the scale starting point, and the number of periods in the overall length Lmax is defined as N1max. In this embodiment, since the track pattern 203a has 40 periods for the overall length of the scale, N1max is 40 and N1 is a natural number from 1 to 40.

Figure 8A:
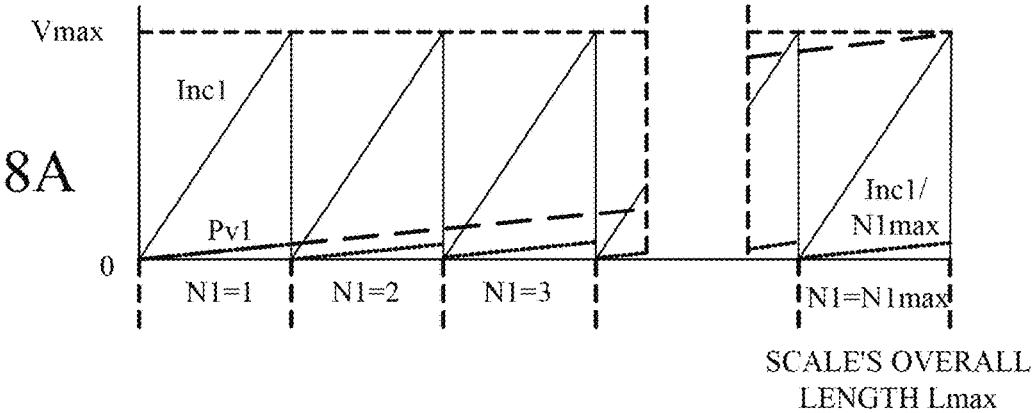
FIGS. 8A to 8D are graphs showing a change in a signal waveform due to a synchronization calculation according to the first embodiment.
Figure 8B:
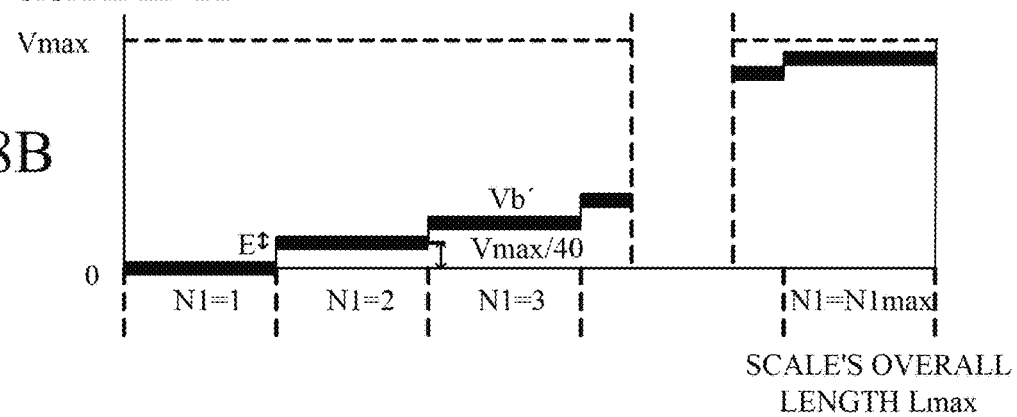

FIG. 8A illustrates waveforms of Inc1, Pv1, and Inc1/N1max. When a difference between Pv1 and Inc1/N1max having the same slope as that of Pv1 is calculated, a stepped waveform having an error component E illustrated in FIG. 8B is generated. A signal Vb' having a waveform illustrated in FIG. 8B is expressed by the following expression (13). Here, the signal level of one step of the stepped waveform is Vmax/N1max.

$$Vb'=Pv1-(Inc1/N1\max) \quad (13)$$

Figure 8C:
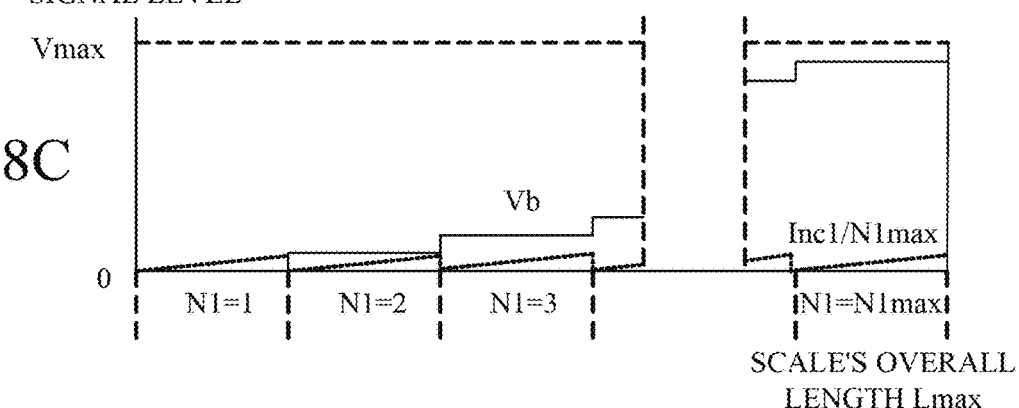

Next, when the error component E of the waveform illustrated in FIG. 8B is removed by rounding off, a waveform illustrated in FIG. 8C is obtained. The signal Vb having the waveform illustrated in FIG. 8C is expressed by the following expression (14).

$$Vb=\text{Round}[Vb'\times(N1\max/V\max)]\times(V\max/N1\max) \quad (14)$$

In the expression (14), Round[ ] is a function that rounds off the first decimal place. The error component E can be expressed as the following expression (15).

$$E=Vb'-Vb \quad (15)$$

Figure 8D:
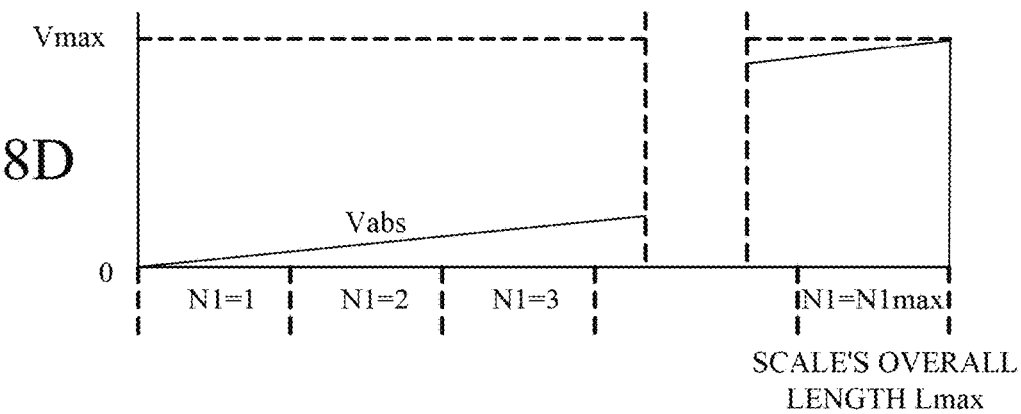

By adding the waveform of Inc1/N1max to the waveform illustrated in FIG. 8C, as illustrated in FIG. 8D, the signal Vabs indicating the absolute position from which the error component E has been eliminated is generated.

This synchronization calculation is performed by the calculation represented by the following expression (16).

$$Vabs=Vb+(Inc1/N1\max) \quad (16)$$

Using the signal Vabs indicating the absolute position, the absolute position Pabs is expressed by the following expression (17).

$$Pabs=Vabs\times(L\max/V\max) \quad (17)$$

As described above, in the step S605, the absolute position Pabs at the execution timing T1 is calculated from the Vernier signal Pv1 and the signal level V1inc1 of the first relative position signal Inc1 at the execution timing T1. Then, the flow proceeds to the step S606 and ends. Thereby, the absolute position Pabs can be calculated.

Referring now to FIGS. 9A and 9B, a description will be given of the reliability Mgn and its calculation. FIG. 9A is a graph showing the reliability Mgn in a normal case. In FIGS. 9A and 9B, the abscissa axis indicates the overall length Lmax, and the ordinate axis indicates the reliability Mgn. The reliability Mgn is expressed by the following expression (18).

$$Mgn = (Vb' \times (N1max/Vmax)) - \text{Round}[Vb' \times (N1max/Vmax)] \quad (18)$$

In other words, the reliability Mgn is fractional part that is rounded in the rounding function Round[ ] performed by the above expression (14). The reliability Mgn is expressed by the following expression (19) using the error component E.

$$Mgn = E \times (N1\ max/Vmax) \quad (19)$$

The closer to 0 the reliability Mgn is, the smaller the error component E becomes, the higher the reliability becomes, and it is determined that the absolute position Pabs is correctly calculated. On the other hand, if the error component E increases, the reliability Mgn decreases as illustrated in FIG. 9B. When the reliability Mgn exceeds 0.5, the value is converted into an adjacent value by rounding off in the synchronization operation, and the reliability Mgn becomes around −0.5. In other words, when a phenomenon that crosses 0.5 and −0.5 occurs, the synchronization calculation fails, and the absolute position Pabs is erroneously detected.

Figure 10A:
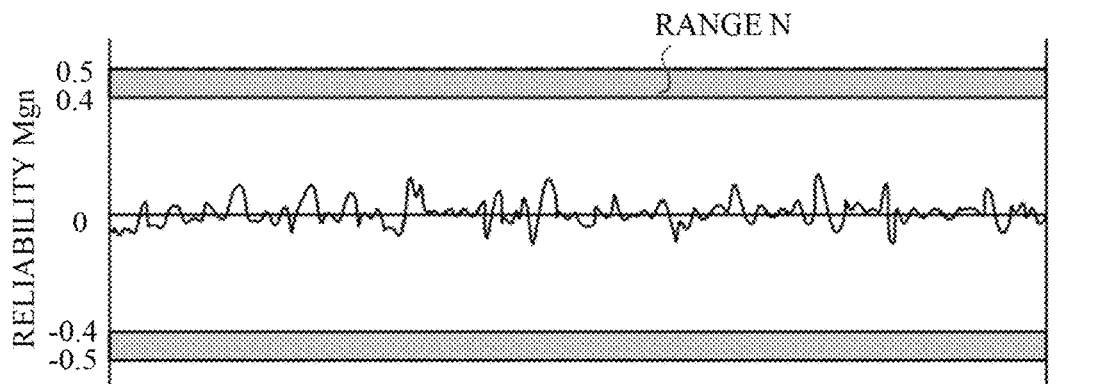
FIGS. 10A and 10B are graphs showing determination criteria for the reliability according to the first embodiment.
Figure 10B:
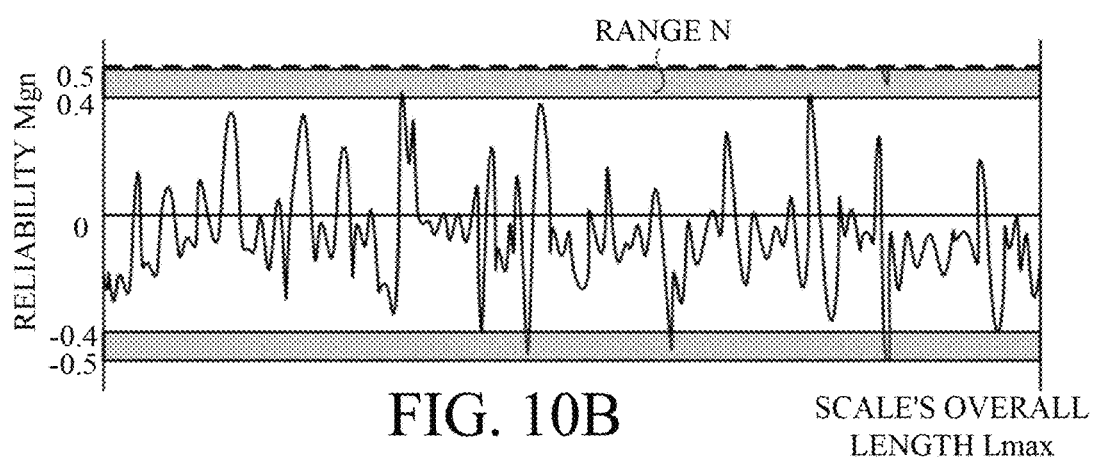

Referring now to FIGS. 10A and 10B, a description will be given of the reliability determination of the absolute position. FIGS. 10A and 10B illustrate the reliability Mgn (determination criteria) when the absolute position reliability determination is applied to FIGS. 9A and 9B, respectively. In FIGS. 10A and 10B, the abscissa axis represents the scale's overall length Lmax, and the ordinate axis represents the reliability Mgn. In this embodiment, the threshold (determination criterion) of the reliability Mgn is set to 0.4. When the reliability Mgn is within ±0.4 (−0.4≤Mgn≤+0.4), it is determined that the absolute position Pabs is reliable. On the other hand, when the reliability Mgn exceeds±0.4 (Mgn<−0.4, Mgn>+0.4), it is determined that the absolute position Pabs is not reliable. In other words, a gray range N in FIGS. 10A and 10B is an area where the absolute position Pabs is determined to be unreliable.

As illustrated in FIG. 10A, the reliability Mgn does not fall within the range N in the normal operation. It is thus determined that the absolute position Pabs is reliable over the entire area. On the other hand, in FIG. 10B, there is a location where the reliability Mgn falls within the range N, and it is determined that the absolute position Pabs is not reliable at that location.

Figure 11:
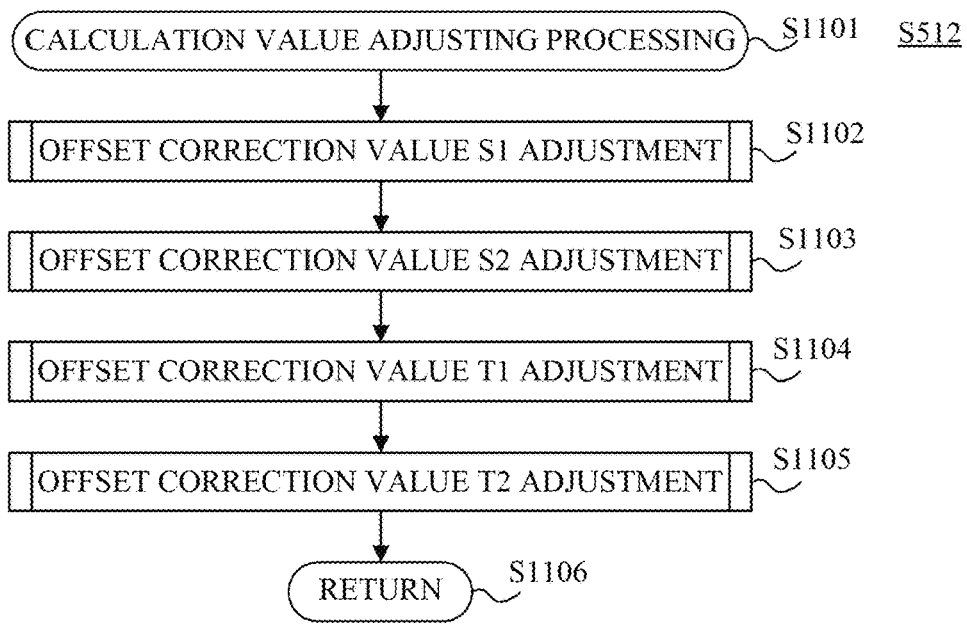
FIG. 11 is a flowchart of correction value adjusting processing according to the first embodiment.

Next follows a description of the correction value adjusting processing. The correction value adjusting unit 109 adjusts the offset correction values S and S2 of the first a-phase displacement signal S1rA and the b-phase displacement signal S1rB and the offset correction values T1 and T2 of the second a-phase displacement signal S2rA and the b-phase displacement signal S2rB, which are stored in the data storage 107. FIG. 11 is a flowchart of the correction value adjusting processing (step S512). Each step in FIG. 11 is executed by the correction value adjusting unit 109.

First, in the step S1101, the correction value adjusting processing starts. Next, in the step S1102, the correction value adjusting unit 109 adjusts the offset correction value S1 of the first a-phase displacement signal S1rA. The adjustment of the offset correction value S1 will be described in detail later. Next, in the step S1103, the correction value adjusting unit 109 adjusts the offset correction value S2 of the first b-phase displacement signal S1rB. Next, in the step S1104, the correction value adjusting unit 109 adjusts the offset correction value T1 of the second a-phase displacement signal S2rA. Next, in the step S1105, the correction value adjusting unit 109 adjusts the offset correction value T2 of the second b-phase displacement signal S2rB. Then, the flow proceeds to the step S1105 and ends.

Next follows a detailed description of the adjustment of the offset correction value S1. The offset correction values S2, T1, and T2 are adjusted in the same manner as that for the offset correction value S1, and thus a description thereof will be omitted. An illustrative description will be given of a change in the reliability Mgn when the offset s1 of the first a-phase displacement signal S1rA changes.

When the offset s1 changes, a difference from the offset correction value S1 occurs in the signal correction of the first a-phase displacement signal S1rA. This difference causes an error in the corrected first a-phase displacement signal S1cA. The signal Atan1 is calculated by the arctangent calculation of the first a-phase displacement signal S1cA and the first b-phase displacement signal S1cB. The first relative position signal Inc1 is calculated from the signal Atan1. Thus, this error results in an error of the Vernier signal Pv1 calculated from the first relative position signal Inc and the second relative position signal Inc2. Thus, the error component E increases in the synchronous calculation of the first relative position signal Inc and the Vernier signal Pv1, and consequently the reliability Mgn decreases. In other words, the greater the difference is between the offset s1 and the offset correction value S1, the lower the reliability Mgn becomes, and the smaller the difference becomes, the higher the reliability Mgn becomes. The offset correction value S1 is adjusted using such a relationship.

Figure 12:
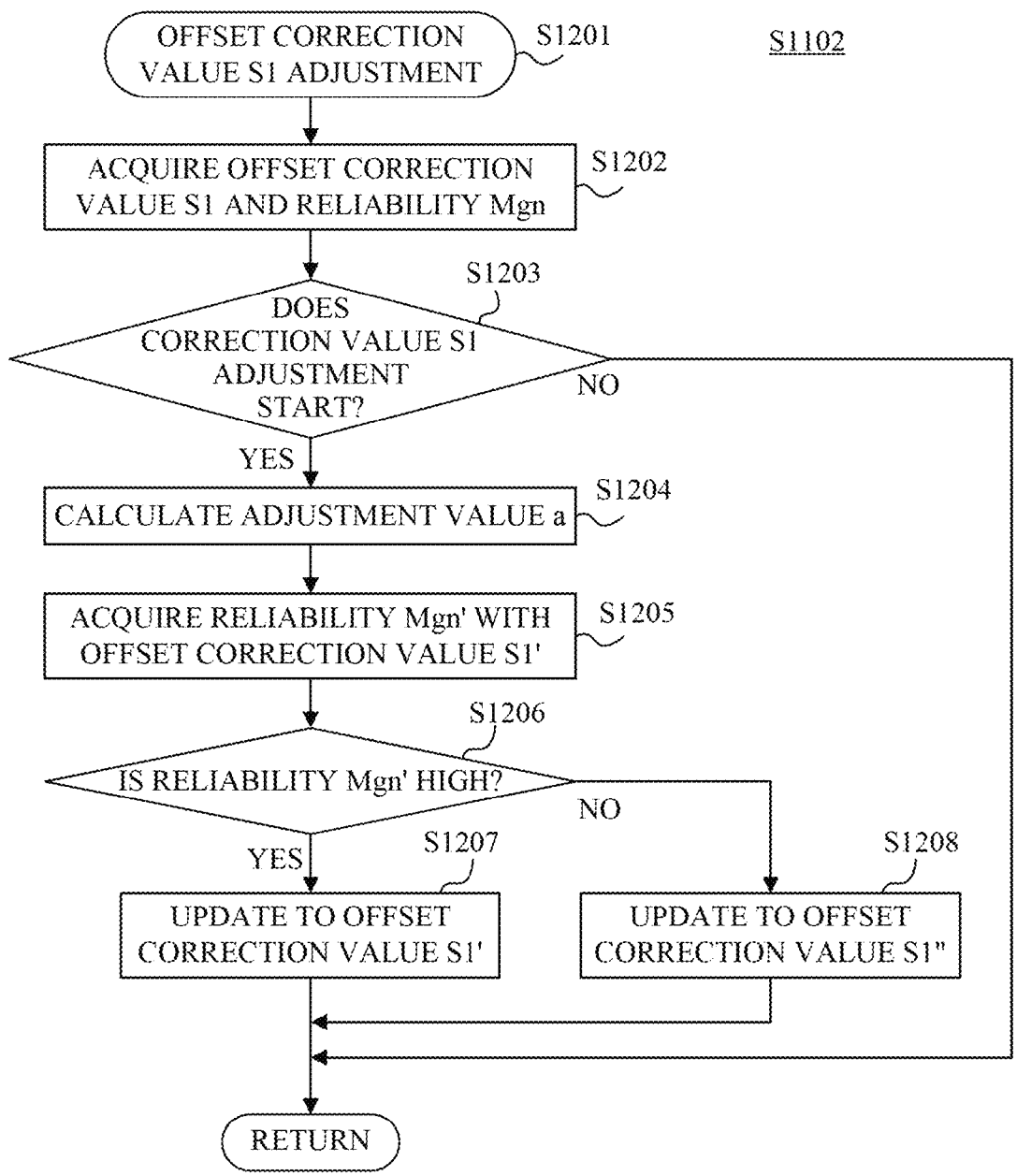
FIG. 12 is a flowchart of offset correction value adjusting processing according to the first embodiment.

FIG. 12 is a flowchart of the offset correction value S1 adjustment. Each step in FIG. 12 is executed by the correction value adjusting unit 109. First, in the step S1201, this process starts. Next, in the step S1202, the correction value adjusting unit 109 acquires the offset correction value S1 and the reliability Mgn stored in the data storage 107. Next, in the step S1203, the correction value adjusting unit 109 determines whether or not to start correction value adjustment based on the reliability Mgn acquired in step S1202. If it is determined to start correction value adjustment, the flow proceeds to the step S1204. On the other hand, if it is determined that the correction value adjustment is not started, the flow proceeds to the step S1209 and ends. The correction value S1 adjustment determination will be described in detail later.

In the step S1204, the correction value adjusting unit 109 calculates an adjustment value a. The adjustment value a calculation will be described in detail later. Next, in the step S1205, the correction value adjusting unit 109 acquires the reliability Mgn' with the offset correction value S1' obtained by changing the offset correction value S by the adjustment value a. Obtaining the reliability Mgn' will be described in detail later. Next, in the step S1206, the correction value adjusting unit 109 compares the reliability Mgn and the reliability Mgn' with each other. When the reliability Mgn' is higher than the reliability Mgn', the flow proceeds to the step S1207. On the other hand, if the reliability Mgn' is lower than the reliability Mgn, the flow proceeds to the step S1208. The reliability Mgn' determination will be described in detail later.

In the step S1207, the correction value adjusting unit 109 updates the offset correction value S1 stored in the data storage 107 to the offset correction value S1', proceeds to the step S1209, and ends this flow. In the step S1208, the correction value adjusting unit 109 updates the offset correction value S1 stored in the data storage 107 to the offset correction value S1", proceeds to step S1209, and ends this flow.

Figure 13:
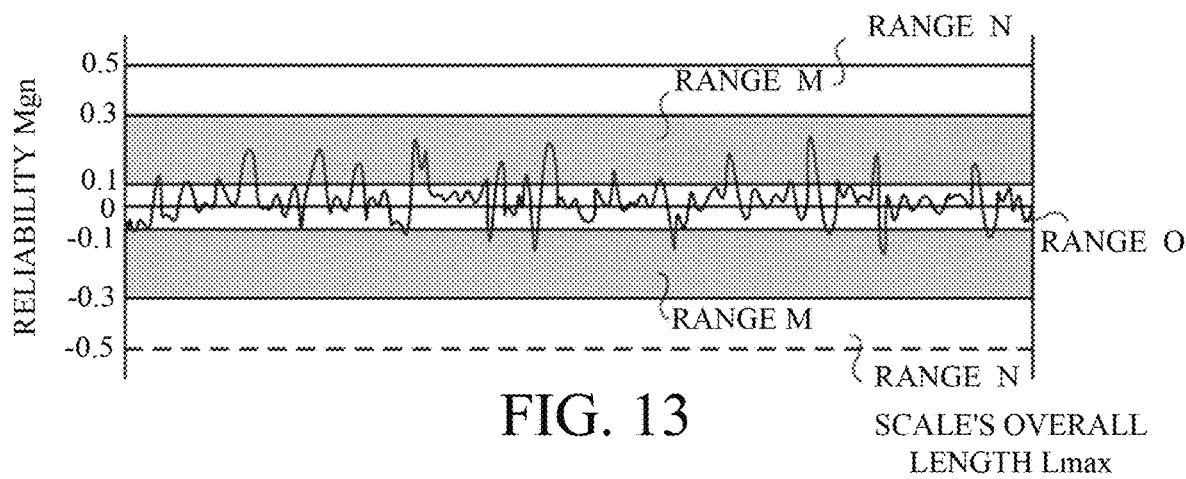
FIG. 13 is a graph showing determination criteria for the correction value adjustment according to the first embodiment.
Figure 14A:
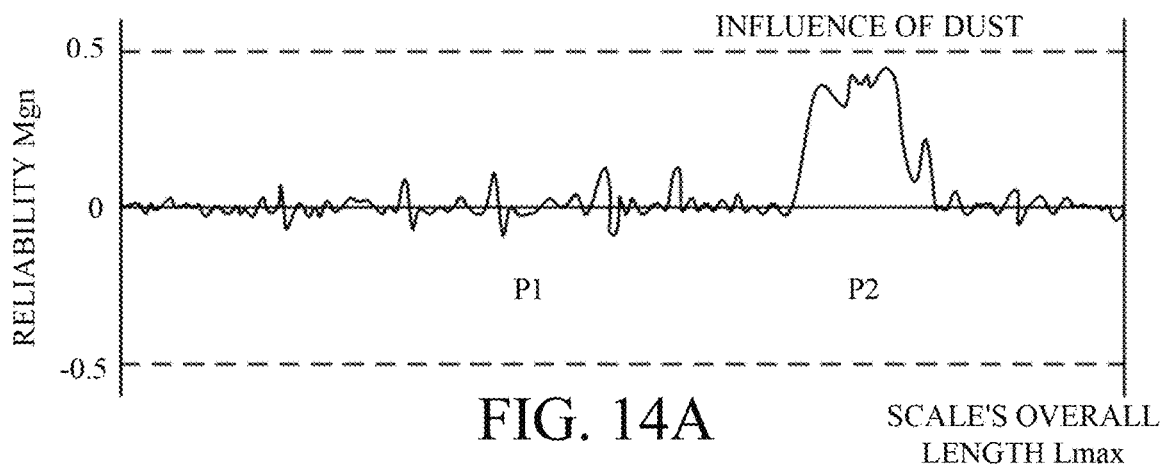
FIGS. 14A and 14B are graphs showing a decrease in the reliability according to the first embodiment.
Figure 14B:
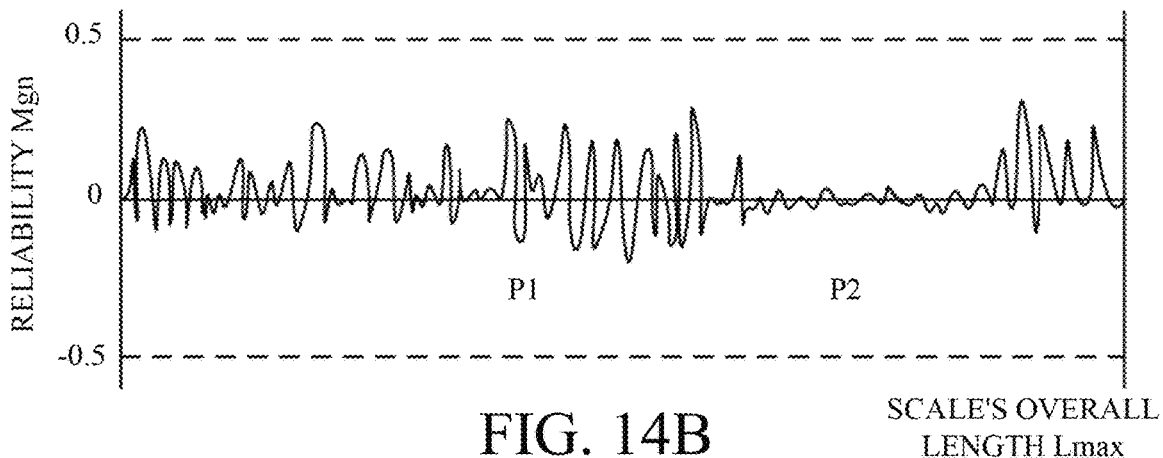

Referring now to FIGS. 13, 14A, and 14B, a description will be given of the correction value S1 adjustment determination. FIG. 13 is a graph showing the determination criteria for adjusting the correction value S1. FIGS. 14A and 14B are graphs showing a decrease in reliability Mgn. Whether or not to start the adjustment of the correction value S1 is determined by whether or not the reliability Mgn is within a threshold range (within a predetermined range). In this embodiment, the threshold (determination criteria) of the reliability Mgn is set to 0.1 and 0.3. When the reliability Mgn is −0.3 or more and less than −0.1 (−0.3≤Mgn<−0.1) or 0.1 or more and 0.3 or less (0.1≤Mgn<0.3), the adjustment of the correction value S1 starts. In other words, a gray range M in FIG. 13 is an area (predetermined area) where the adjustment of the correction value S1 starts.

A description will be given of the reason why it is determined that the correction value S1 adjustment is not started within the range N (Mgn<−0.3, Mgn≥0.3) in FIG. 13. For example, when the abnormality such as dust is present on the scale unit 202, the reliability Mgn may partially change for the overall length of the scale as illustrated in FIG. 14A. At the position P where there is no influence of dust, the reliability Mgn is the same as that in the normal case, but at the position P2 where there is influence of dust, the reliability Mgn decreases and approaches to 0.5. If the correction value S1 is adjusted at the position P2 affected by dust, the cause of the decrease in the reliability Mgn is not due to the difference between the offset s1 and the offset correction value S1, and thus an erroneous adjustment occurs.

The erroneous adjustment at the position P2 affected by dust, as illustrated in FIG. 14B, increases the reliability Mgn of the position P2 affected by dust, while decreasing the reliability Mgn of the position P1 not affected by dust. Thus, when it is clearly determined that the reliability Mgn is lowered due to the influence of dust, the erroneous adjustment can be prevented by not starting the adjustment of the correction value S1.

Next follows a description of a reason why it is determined that the adjustment of the correction value S1 is not started within a range O (−0.1≤Mgn<0.1) in FIG. 13. When the correction value S1 is adjusted with the reliability Mgn of exactly or nearly 0, the reliability Mgn may become lower. When the offset correction value S1 is sufficiently close to the offset s1, the offset correction value S1'S1" causes a larger difference from the offset s than that with the offset correction value S1 and thus an excessive adjustment. Hence, when it is determined that the reliability Mgn is sufficiently high, it is possible to prevent the excessive adjustment by not starting the correction value S1 adjustment. The above correction value S adjustment determination can prevent the erroneous adjustment and excessive adjustment of the correction value S1.

Figure 15:
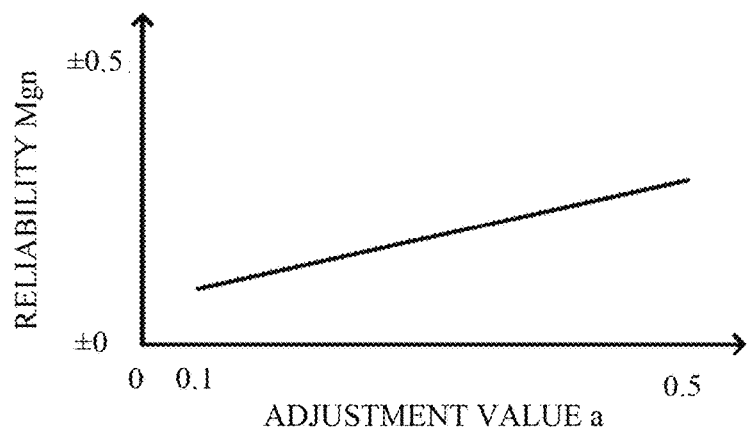
FIG. 15 is a graph showing a relationship between the reliability and the adjustment value according to the first embodiment.

Referring now to FIG. 15, a description will be given of the adjustment value a calculation. FIG. 15 is a graph showing a relationship between the reliability Mgn and the adjustment value a. In FIG. 15, the abscissa axis represents the adjustment value a, and the ordinate axis represents the reliability Mgn. The adjustment value a is a change amount when the offset correction value S1 is changed to be the offset correction value S1' or the offset correction value S1". The adjustment value a is calculated based on the reliability Mgn.

When it is determined that the reliability Mgn is high (for example, when it is determined that the reliability Mgn is higher than the predetermined reliability), the adjustment value a is decreased. On the other hand, when it is determined that the reliability Mgn is low (for example, when it is determined that the reliability Mgn is lower than the predetermined reliability), the adjustment value a is increased. In this embodiment, as illustrated in FIG. 15, the adjustment value a is linearly changed relative to the reliability Mgn. For example, when the reliability Mgn is 0.1, the adjustment value a is set to 0.1, and when the reliability Mgn is −0.3, the adjustment value a is set to 0.5. By calculating the adjustment value a as described above, the reliability Mgn can be efficiently increased.

Next follows a description of the acquisition of the reliability Mgn'. First, the correction value adjusting unit 109 calculates the offset correction value S1'. This embodiment assumes that the relationship of the following expression (20) is established using the adjustment value a between the offset correction value S1 and the offset correction value S1'.

$$S1'=S1+a \quad (20)$$

Next, the correcting unit 106 corrects the signal level V1rA of the first a-phase displacement signal S1rA at the execution timing T1 stored in the data storage 107, using the offset correction value S1' calculated by the correction value adjusting unit 109. In addition, the correction unit 106 corrects the signal level of another displacement signal stored in the data storage 107 using the offset correction values S2, T1, and T2. A1, A2, B1, and B2 are used for the amplitude correction, respectively. Next, the ABS calculating unit 102 calculates the absolute position Pabs', and the reliability calculating unit 108 calculates the reliability Mgn'. Thereby, the reliability Mgn' with the offset correction value S1' can be acquired.

Next follows a description of the reliability Mgn' determination. As described above, the greater the difference is between the offset s1 and the offset correction value S1, the lower the reliability Mgn becomes, and the smaller the difference becomes, the higher the reliability Mgn becomes. Hence, when the reliability Mgn' is higher than the reliability Mgn, the difference between the offset correction value S1' and the offset s1 is smaller than that between the offset correction value S1 and the offset s1. In other words, the offset correction value S1' is more suitable for the correction value than the offset correction value S1. On the other hand, when the reliability Mgn' is lower than the reliability Mgn, the offset correction value S1' has a larger difference from the offset s1 than the offset correction value S1. Hence, the offset correction value S1' is less suitable for the correction value than the offset correction value S1. At this time, the offset correction value S1" more proper than the offset correction value S1 can be derived by the following expression (21).

$$S1''=S1-a \quad (21)$$

The above reliability Mgn' determination can determine an offset correction value that is more suitable than the offset correction value S. As described above, this embodiment can provide a position detecting apparatus that detects the position of the movable element relative to the fixed element, while maintaining the reliability of the absolute position signal even during normal use.

Second Embodiment

Figure 16:
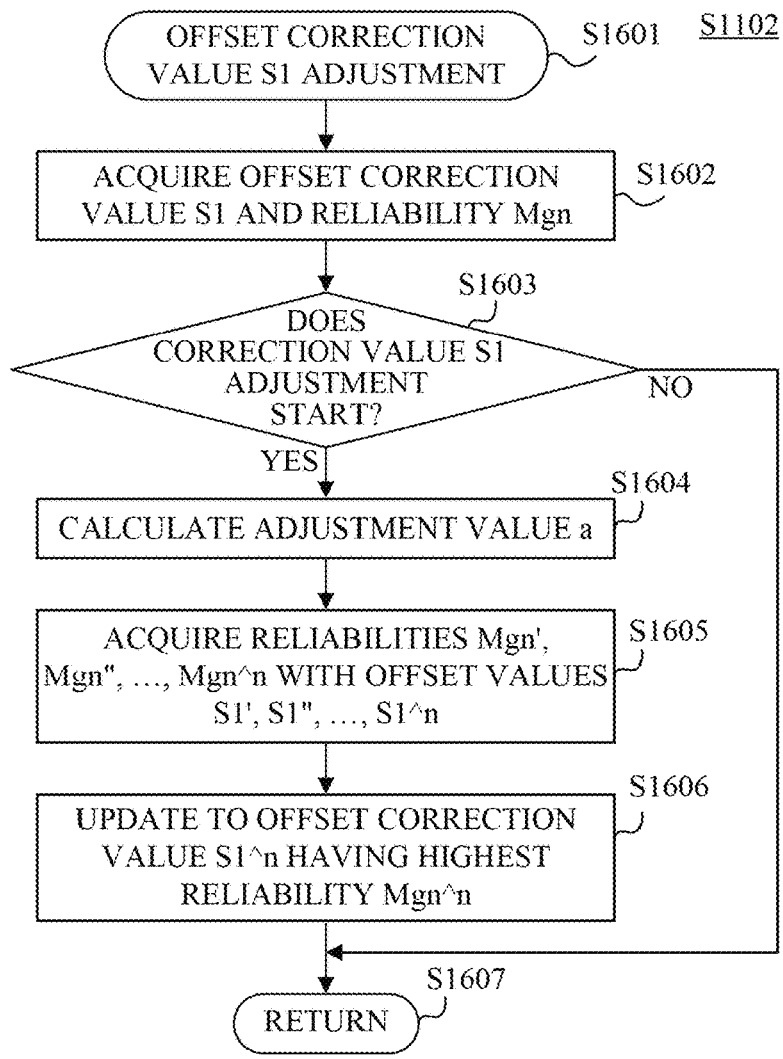
FIG. 16 is a flowchart of offset correction value adjusting processing according to a second embodiment.

Referring now to FIG. 16, a description will be given of a second embodiment according to the present invention. This embodiment omits a description of the same configuration and method as those of the first embodiment.

FIG. 16 is a flowchart of the offset correction value S1 adjustment according to this embodiment. Each step in FIG. 16 is executed by the correction value adjusting unit 109. First, in the step S1601, this process starts. Next, in the step S1602, the correction value adjusting unit 109 acquires the offset correction value S1 and the reliability Mgn stored in the data storage 107. Next, in the step S1603, the correction value adjusting unit 109 determines whether or not to start correction value adjustment based on the reliability Mgn acquired in the step S1602. If it is determined that correction value adjustment is started, the flow proceeds to the step S1604. On the other hand, if it is determined that the correction value adjustment is not started, the flow proceeds to the step S1607 and ends. The details of the correction value S adjustment determination are the same as those of the first embodiment.

In the step S1604, the correction value adjusting unit 109 calculates an adjustment value a. The details of the adjustment value a calculation are the same as those of the first embodiment. Next, in the step S1605, the correction value adjusting unit 109 acquires a plurality of reliabilities Mgn', Mgn", ..., Mgn^n with a plurality of (three or more) offset correction values S1', S1", ..., S1^n that is made by multiplying the offset correction value S1 by a constant multiple of the adjustment value a, where n is a natural number of 3 or more. A plurality of reliabilities Mgn', Mgn", ..., Mgn^n are acquired in a manner similar to that of an acquisition of the reliability Mgn' of the first embodiment.

Next, in the step S1606, the correction value adjusting unit 109 updates the offset correction value S1 stored in the data storage 107 to the offset correction value S1^n having the highest reliability among the plurality of reliabilities Mgn', Mgn", ..., Mgn^n. Then, the flow proceeds to the step S1607 and ends. As described above, this embodiment can compare and adjust a plurality of correction values.

Third Embodiment

Figure 17:
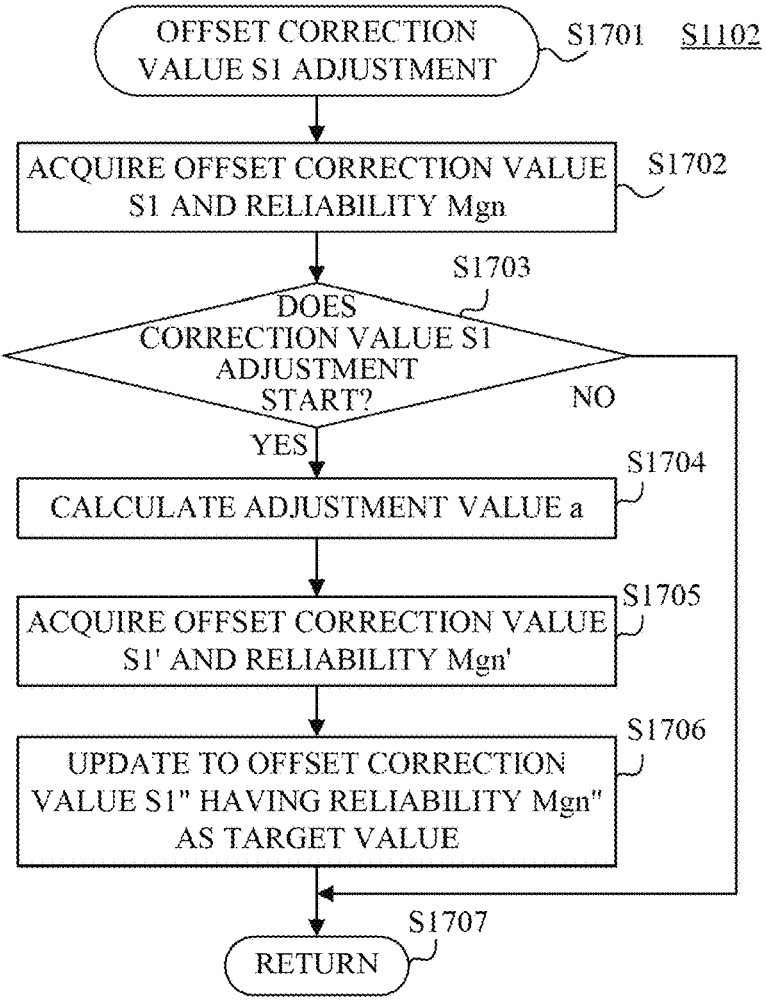
FIG. 17 is a flowchart of offset correction value adjusting processing according to a third embodiment.
Figure 18:
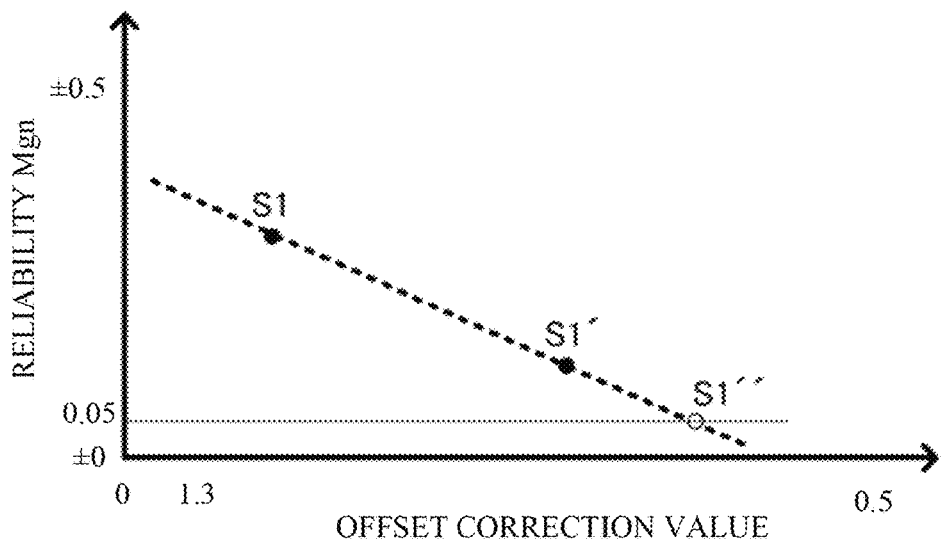
FIG. 18 is a graph showing a prediction of an offset correction value according to the third embodiment.

Referring now to FIGS. 17 and 18, a description will be given of a third embodiment according to the present invention. This embodiment omits a description of the same configuration and method as those of the first embodiment.

FIG. 17 is a flowchart of the offset correction value S1 adjustment according to this embodiment. Each step in FIG. 17 is executed by the correction value adjusting unit 109. First, in the step S1701, this process starts. Next, in the step S1702, the correction value adjusting unit 109 acquires the offset correction value S1 and the reliability Mgn stored in the data storage 107. Next, in the step S1703, the correction value adjusting unit 109 determines whether to start correction value adjustment based on the reliability Mgn acquired in the step S1702. If it is determined to start correction value adjustment, the flow proceeds to step S1704. On the other hand, if it is determined not to start the correction value adjustment, the flow proceeds to the step S1707 and ends.

The details of the correction value S1 adjustment determination are the same as those of the first embodiment.

In the step S1704, the correction value adjusting unit 109 calculates an adjustment value a. The details of the adjustment value a calculation are the same as those of the first embodiment. Next, in the step S1705, the correction value adjusting unit 109 acquires the reliability Mgn' with the offset correction value S1' obtained by changing the offset correction value S1 by the adjustment value a. The details of obtaining the reliability Mgn' are the same as those of the first embodiment.

Next, in the step S1706, the correction value adjusting unit 109 updates the offset correction value S1 stored in the data storage 107 to the offset correction value S1" having the reliability Mgn" as a target value. Then, the flow proceeds to the step S1707 and ends. In this embodiment, the target value of the reliability Mgn" is set to 0.05.

FIG. 18 is a graph showing the prediction of the offset correction value, and illustrates the relationship between the offset correction value and the reliability Mgn. As illustrated in FIG. 18, based on the reliability Mgn with the offset correction value S1 and the reliability Mgn' with the offset correction value S1', the offset correction value S1" having the reliability Mgn" is predicted. Thereby, the offset correction value S1" can be calculated. As described above, this embodiment can predict and adjust the correction value.

Each of the above embodiments adjusts the offset correction values S1, S2, T1, and T2. However, the present invention is not limited to this embodiment, and the amplitude correction values A1, A2, B1, and B2 can be adjusted by a similar method. Each embodiment performs the correction value adjusting processing after the absolute position reliability determination. However, the present invention is not limited to this embodiment, and the correction value adjusting processing may be performed before the absolute position reliability determination as long as it is after the reliability calculation. Even in this case, the correction value adjusting processing can be performed. In each embodiment, in changing the adjustment value a, the adjustment value a is linearly changed with the reliability Mgn. However, the present invention is not limited to this embodiment. The linearity is unnecessary as long as the adjustment value a is decreased if it is determined that the reliability Mgn is high and the adjustment value a is increased if the reliability Mgn is low. Even in this case, the correction value adjusting processing can be performed efficiently.

Fourth Embodiment

Referring now to FIGS. 19 to 25, a description will be given of a fourth embodiment according to the present invention. This embodiment omits a description of the same configuration and method as those of the first embodiment.

Figure 19:
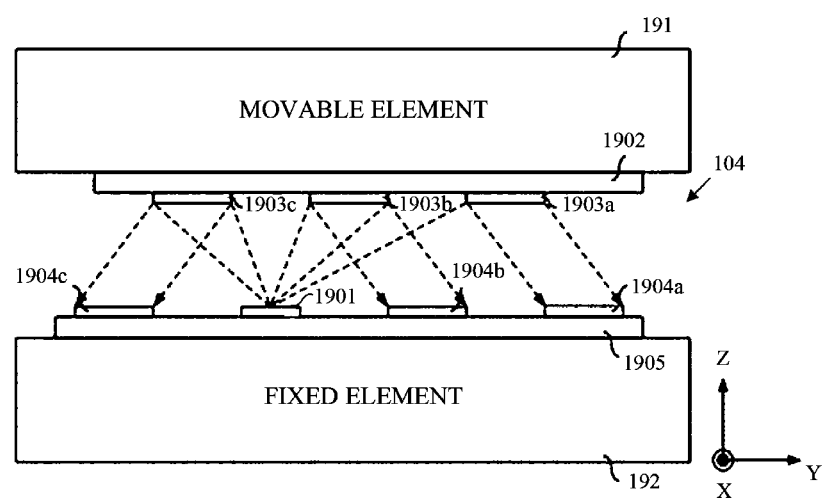
FIG. 19 is a sectional view of an ABS sensor according to a fourth embodiment.

FIG. 19 is a sectional view of the ABS sensor 104 according to this embodiment. In FIG. 19, a movable element 191 is movable member configured to move in a direction perpendicular to the paper surface (X-axis direction). A fixed element 192 is an element configured to serve as a reference for the absolute position of the movable element 191. A light source 1901 is a light emitting unit, such as an LED. A scale portion 1902 has three track patterns 1903a, 1903b, and 1903c that are equally spaced and have different numbers of slits for the overall length. The light receiving units 1904a, 1904b, and 1904c receive light from the light source 1901 reflected by the track patterns 1903a, 1903b, and 1903c, respectively, and include, for example, photodiode arrays.

A signal processing circuit 1905 processes signals received by the light receiving units 1904a, 1904b, and 1904c, and outputs a signal of any one of the track patterns 1903a, 1903b, and 1903c in accordance with the switching signal of the scale switching unit 103. In this embodiment, the movable element 191 has the scale portion 1902 and the fixed element 192 has the light source 1901 and the light receiving units 1904a, 1904b, and 1904c, but the present invention is not limited to this embodiment. For example, the scale element 1902 may be provided on the fixed element 192, and the light source 1901 and the light receiving units 1904a, 1904b, and 1904c may be provided on the movable element 191.

Figure 20:
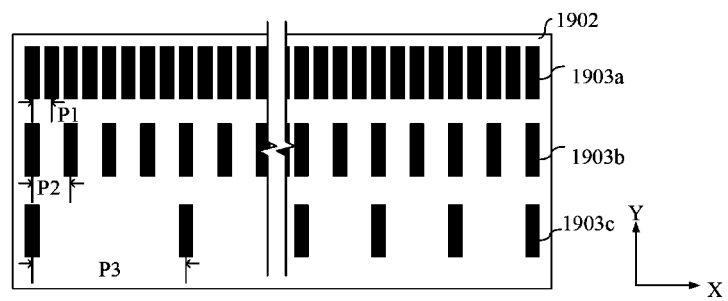
FIG. 20 is a plan view of a scale portion according to the fourth embodiment.

FIG. 20 is a plan view of the scale portion 1902 according to this embodiment. Although FIG. 20 illustrates a reflection type slit pattern as an example, another configuration such as a transmission type slit pattern may be employed. The scale portion 1902 includes three track patterns, i.e., a track pattern (first track pattern) 1903a, a track pattern (second track pattern) 1903b, and a track pattern (third track pattern) 1903c. The reflectors in the track patterns 1903a, 1903b, and 1903c are arranged at regular intervals P1, P2, and P3, respectively. When light emitted from the light source 1901 enters the reflectors in the track patterns 1903a and 1903b, the light is reflected toward the light receiving units 1904a, 1904b, and 1904c, respectively. In this embodiment, the interval P1 is configured with 161 reflectors for the overall length of the scale or 161 periods for the overall length Lmax. The interval P2 is configured with 80 reflectors for the overall length of the scale or 80 periods for the overall length Lmax. The interval P3 is configured with 37 reflectors for the overall length of the scale or 37 periods for the overall length Lmax.

Similar to the first embodiment, the signal processing circuit 1905 generates the first a-phase displacement signal S1rA as the a-phase displacement signal and the first b-phase displacement signal S1rB as the b-phase displacement signal of the track pattern 1903a, based on the signal from the light receiving unit 1904a. The signal processing circuit 1905 generates the second a-phase displacement signal S2rA as the a-phase displacement signal and the second b-phase displacement signal S2rB as the b-phase displacement signal of the track pattern 1903b based on the signal from the light receiving unit 1904b, respectively. The signal processing circuit 1905 generates the third a-phase displacement signal S3rA as the a-phase displacement signal and the third b-phase displacement signal S3rB as the b-phase displacement signal of the track pattern 1903c based on the signal from the light receiving unit 1904c, respectively. Herein, the signal processing circuit 1905 (ABS sensor 104) outputs a displacement signal selected in accordance with the switching signal from the scale switching unit 103. In other words, the ABS sensor 104 outputs the first a-phase displacement signal S1rA and the first b-phase displacement signal S1rB, the second a-phase displacement signal S2rA and the second b-phase displacement signal S2rB, or the third a-phase displacement signal S3rA and the third b-phase displacement signal S3rB.

Figure 21:
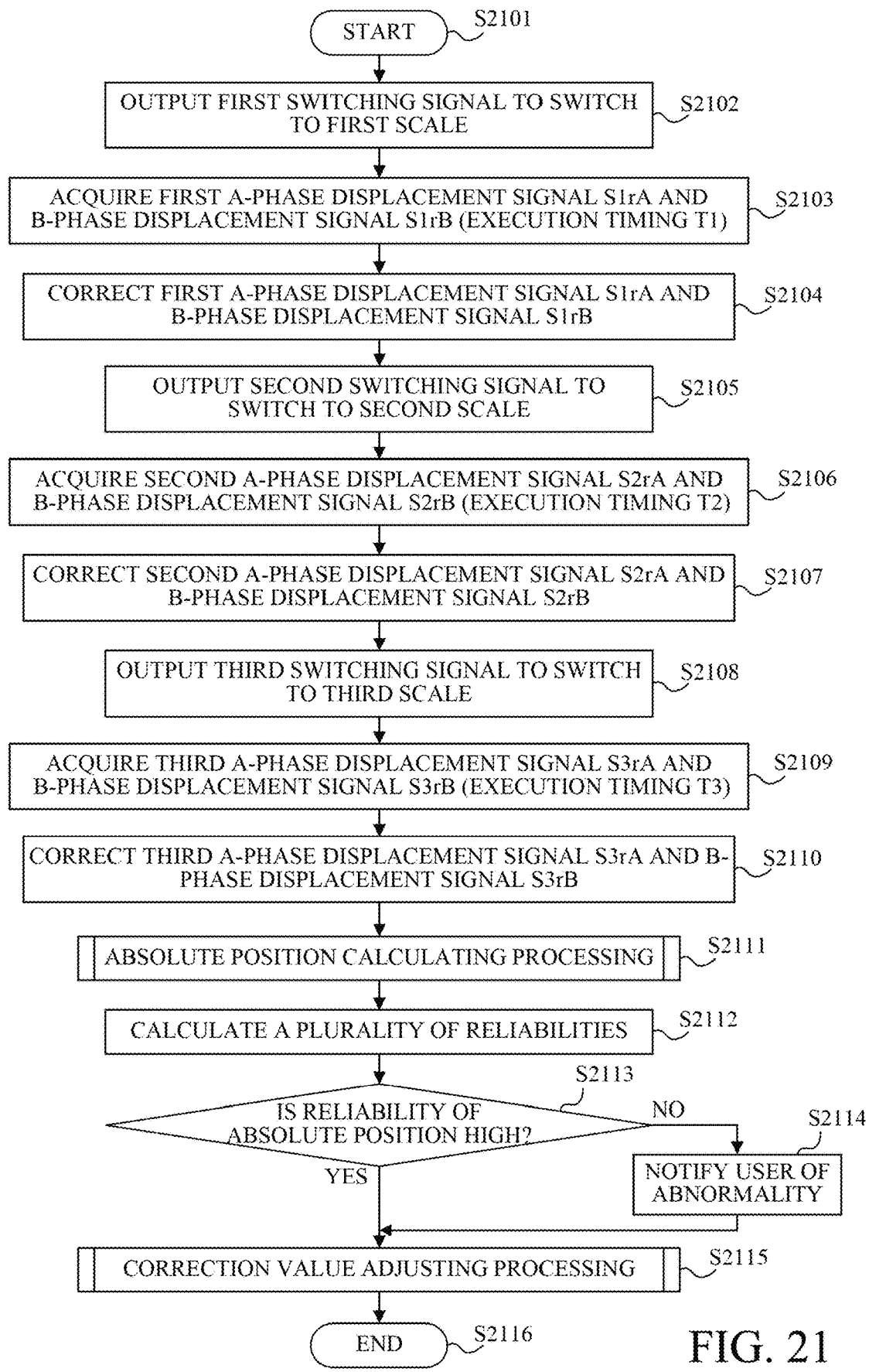
FIG. 21 is a flowchart showing the operation of the position detecting apparatus according to the fourth embodiment.

Next follows a description of an operation of the position detecting apparatus 100 according to this embodiment. FIG. 21 is a flowchart showing the operation of the position detecting apparatus 100. Each step in FIG. 21 is executed by each unit of the position detecting apparatus 100.

First, in the step S2101, this flow starts. This flow (absolute position Pabs determining processing) starts when the ABS determining unit 101 requests the ABS calculating unit 102 to calculate the absolute position Pabs. Next, in the step S2102, the ABS calculating unit 102 outputs a first switching signal for switching to the first scale (track pattern 1903a) to the scale switching unit 103. In response to the first switching signal, the scale switching unit 103 instructs the ABS sensor 104 to output a signal of the track pattern 1903a. Then, the ABS sensor 104 outputs a first a-phase displacement signal S1rA and a first b-phase displacement signal S1rB. The first a-phase displacement signal S1rA and the first b-phase displacement signal S1rB are converted into digital signals by the A/D converter 105 and output to the ABS calculating unit 102.

Next, in the step S2103, the correction unit 106 acquires the signal level V1rA of the first a-phase displacement signal S1rA and the signal level V1rB of the first b-phase displacement signal S1rB at the execution timing T1 of the step S2103 output from the A/D converter 105. At the same time, the data storage 107 stores the signal level V1rA of the first a-phase displacement signal S1rA and the signal level V1rB of the first b-phase displacement signal S1rB.

Next, in the step S2104, the correction unit 106 corrects the signal level V1rA of the first a-phase displacement signal S1rA and the signal level V1rB of the first b-phase displacement signal S1rB at the execution timing T1. Herein, the correction is made in the same manner as that in the first embodiment. a1 and a2 are an amplitude correction value A1 of the first a-phase displacement signal S1rA and an amplitude correction value A2 of the first b-phase displacement signal S1rB, respectively, and stored in the data storage 107. Further, s1 and s2 are an offset correction value S1 of the first a-phase displacement signal S1rA and an offset correction value S2 of the first b-phase displacement signal S1rB, respectively, and stored in the data storage 107.

Next, in the step S2105, the ABS calculating unit 102 outputs a second switching signal for switching to the second scale (track pattern 1903b) to the scale switching unit 103. In response to the second switching signal, the scale switching unit 103 instructs the ABS sensor 104 to output a signal of the track pattern 1903b. The ABS sensor 104 outputs a second a-phase displacement signal S2rA and a second b-phase displacement signal S2rB. The second a-phase displacement signal S2rA and the second b-phase displacement signal S2rB are converted into digital signals by the A/D converter 105 and output to the correction unit 106.

Next, in the step S2106, the correction unit 106 acquires the signal level V2rA of the second a-phase displacement signal S2rA and the signal level V2rB of the second b-phase displacement signal S2rB at the execution timing T2 of step S2106 output from the A/D converter 105. At the same time, the data storage 107 stores the signal level V2rA of the second a-phase displacement signal S2rA and the signal level V2rB of the second b-phase displacement signal S2rB.

Next, in the step S2107, the correction unit 106 corrects the signal level V2rA of the second a-phase displacement signal S2rA and the signal level V2rB of the second b-phase displacement signal S2rB at the execution timing T2. Herein, the correction is made in the same manner as that of the first embodiment. b1 and b2 are an amplitude correction value B1 of the second a-phase displacement signal S2rA and an amplitude correction value B2 of the second b-phase displacement signal S2rB, respectively, and stored in the data storage 107. t1 and t2 are an offset correction value T1 of the second a-phase displacement signal S2rA and an offset correction value T2 of the second b-phase displacement signal S2rB, respectively, and stored in the data storage 107.

Next, in the step S2108, the ABS calculating unit 102 outputs a third switching signal for switching to the third scale (track pattern 1903c) to the scale switching unit 103. In response to the third switching signal, the scale switching unit 103 instructs the ABS sensor 104 to output a signal of the track pattern 1903b. The ABS sensor 104 outputs a third a-phase displacement signal S3rA and a third b-phase displacement signal S3rB. The third a-phase displacement signal S3rA and the third b-phase displacement signal S3rB are converted into digital signals by the A/D converter 105 and output to the correction unit 106.

Next, in the step S2109, the correction unit 106 acquires the signal level V3rA of the third a-phase displacement signal S3rA and the signal level V3rB of the third b-phase displacement signal S3rB at the execution timing T3 of the step S2109 output from the A/D converter 105. At the same time, the data storage 107 stores the signal level V3rA of the third a-phase displacement signal S3rA and the signal level V3rB of the third b-phase displacement signal S3rB.

Next, in the step S2110, the correction unit 106 corrects the signal level V3rA of the third a-phase displacement signal S3rA and the signal level V3rB of the third b-phase displacement signal S3rB at the execution timing T3. Herein, the correction is made in the same manner as that of the first embodiment. c1 and c2 are an amplitude correction value C1 of the third a-phase displacement signal S3rA and an amplitude correction value C2 of the third b-phase displacement signal S3rB, respectively, and stored in the data storage 107. u1 and u2 are an offset correction value U1 of the third a-phase displacement signal S3rA and an offset correction value U2 of the third b-phase displacement signal S3rB, respectively, and stored in the data storage 107.

Next, in the step S2111, the ABS calculating unit 102 calculates the absolute position Pabs. The absolute position calculating processing will be described in detail later. Next, in the step S2112, the reliability calculating unit 108 calculates a plurality of reliabilities Mgn1, Mgn2, Mgn3, and Mgn4 that are parameters indicating the reliability of the absolute position Pabs calculated in the step S2111. The plurality of reliabilities will be described in detail later. The data storage 107 stores a plurality of reliabilities Mgn1, Mgn2, Mgn3, and Mgn4.

Next, in the step S2113, the reliability calculating unit 108 determines the reliability of the absolute position Pabs calculated in the step S2111 based on the plurality of reliability Mgn1, Mgn2, Mgn3, and Mgn4 calculated in the step S2112. If it is determined that the reliability is high, the flow proceeds to the step S2115. On the other hand, if it is determined that the reliability is low, the flow proceeds to the step S2114.

In the step S2114, an abnormality notifying unit (not shown) such as an LED notifies the user of the abnormality, and proceeds to the step S2115. In the step S2115, the correction value adjusting unit 109 performs correction value adjusting processing, and proceeds to the step S2116. The correction value adjusting processing will be described in detail later. In the step S2116, this flow ends. According to this flow, the ABS determining unit 101 determines the absolute position Pabs calculated by the ABS calculating unit 102 as the absolute position of the movable element 191 (the position of the object).

Figure 22:
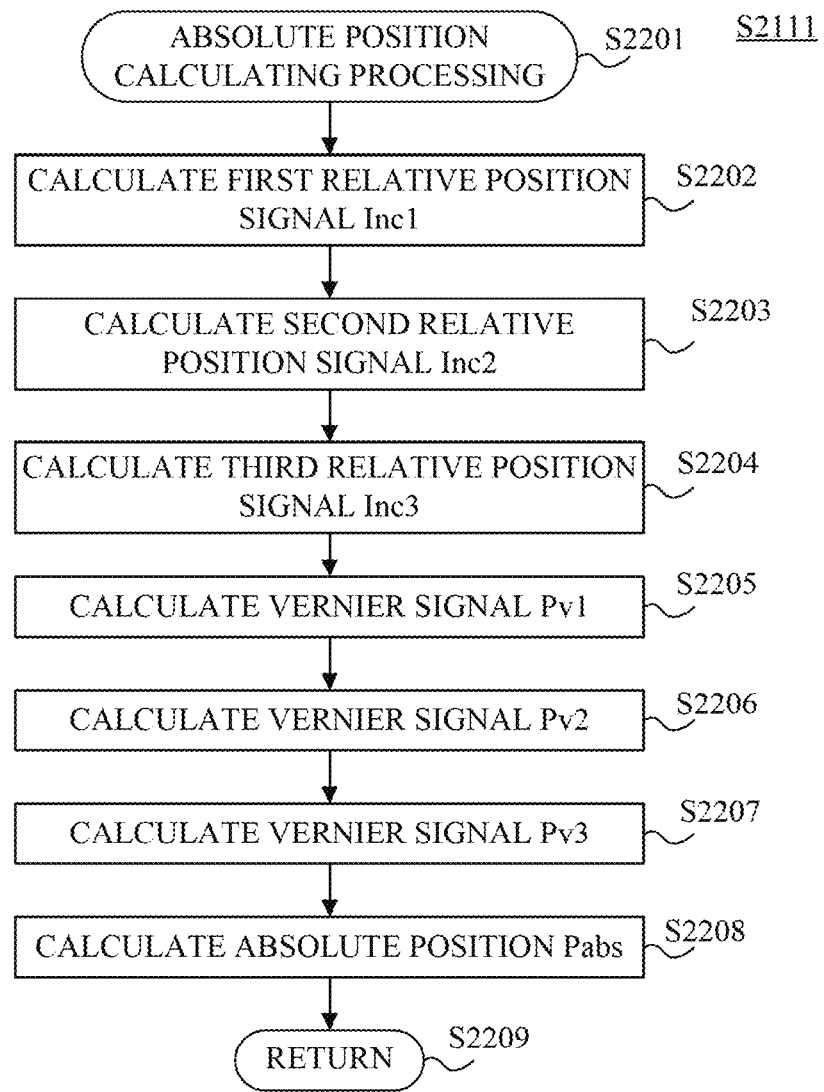
FIG. 22 is a flowchart showing absolute position calculating processing according to the fourth embodiment.
Figure 23A:
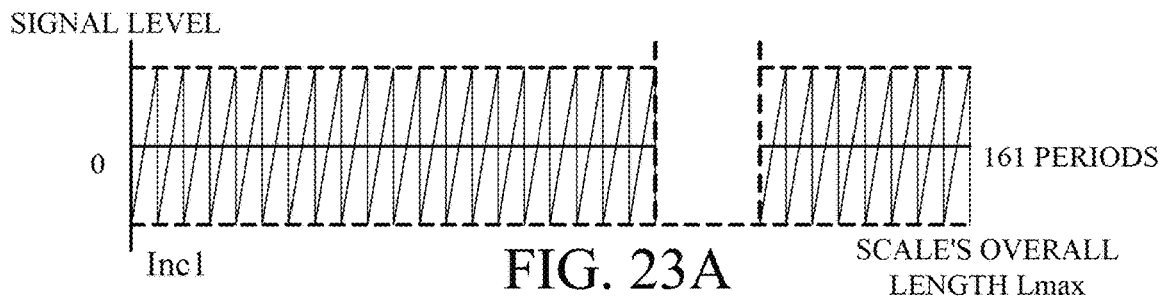
FIGS. 23A to 23F are signal graphs according to the fourth embodiment.
Figure 23B:
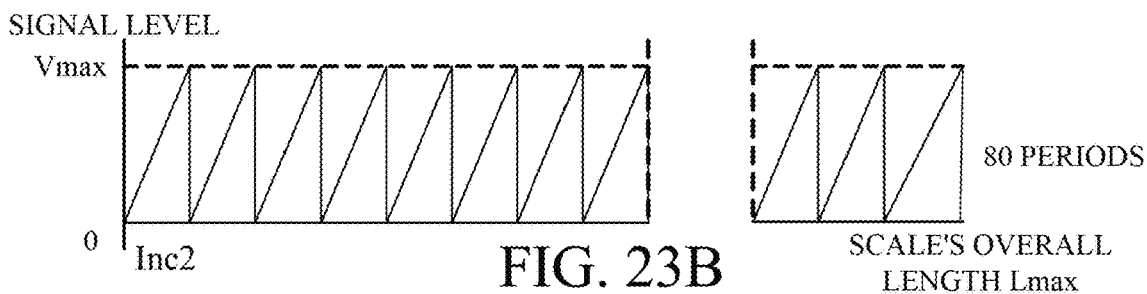
Figure 23C:
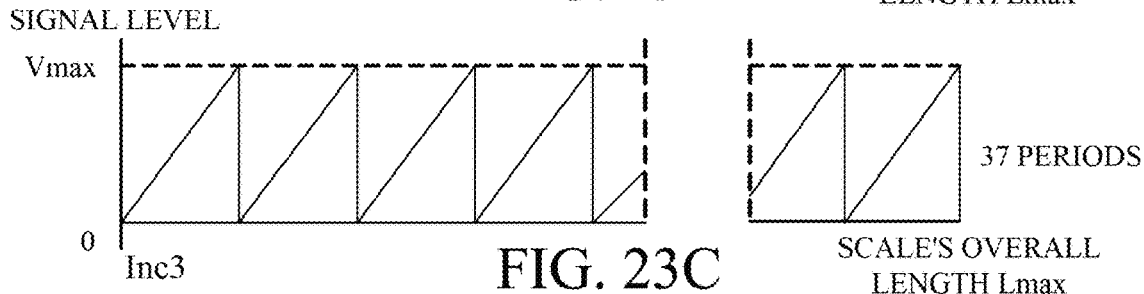
Figure 23D:
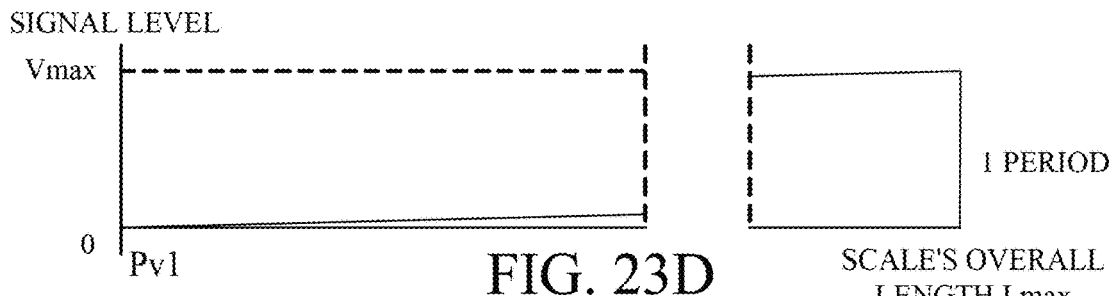
Figure 23E:
Figure 23F:
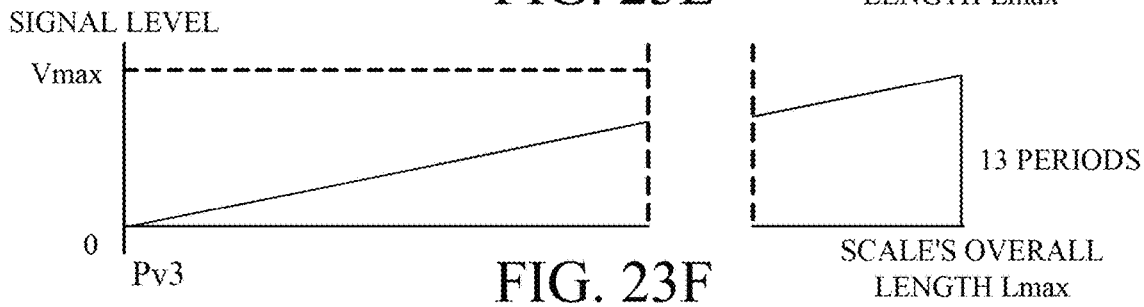

Referring now to FIGS. 22 and 23A to 23F, a description will be given of the absolute position calculating processing (step S2111). FIG. 22 is a flowchart illustrating absolute position calculating processing (calculation processing of the absolute position Pabs). Each step in FIG. 22 is executed by the ABS calculating unit 102. FIGS. 23A to 23F are graphs of each signal. FIGS. 23A to 23C show the first relative position signal Inc1, the second relative position signal Inc2, and the third relative position signal Inc3, respectively. FIGS. 23D to 23F illustrate Vernier signals Pv1, Pv2, and Pv3, respectively. In each of FIGS. 7A to 7F, the abscissa axis indicates the position in the overall length of the scale, and the ordinate axis indicates the signal level.

First, in the step S2201, this flow starts. Next, in the step S2202, the ABS calculating unit 102 calculates the first relative position signal Inc1 having an amplitude Vmax and 161 periods for the overall length of the scale as illustrated in FIG. 23A, using the corrected first a-phase displacement signal S1cA and first b-phase displacement signal S1cB. Similar to the first embodiment, this embodiment calculates the signal level V1inc1 of the first relative position signal Inc1 at the execution timing T1.

Next, in the step S2203, the ABS calculating unit 102 calculates the second relative position signal Inc2 having an amplitude Vmax and 80 periods for the overall length of the scale as illustrated in FIG. 23B, using the corrected second a-phase displacement signal S2cA and second b-phase displacement signal S2cB. Herein, similar to the step S2202, the signal level V2inc2 of the second relative position signal Inc2 at the execution timing T2 is calculated.

Next, in the step S2204, the ABS calculating unit 102 calculates the third relative position signal Inc3 having an amplitude Vmax and 37 periods for the overall length of the scale as illustrated in FIG. 23C, using the corrected third a-phase displacement signal S3cA and third b-phase displacement signal S3cB. Herein, similar to the step S2202, the signal level V3inc3 of the third relative position signal Inc3 at the execution timing T3 is calculated.

Next, in the step S2205, the ABS calculating unit 102 calculates the Vernier signal Pv1 based on the signal level V1inc1 of the first relative position signal Inc at the execution timing T1 and the signal level V2inc2 of the second relative position signal Inc2 at the execution timing T2. The Vernier signal Pv1 calculated at this time is illustrated in FIG. 23D. The second relative position signal Inc2 is a signal of 80 periods for the overall length of the scale. Herein, by doubling the amplitude Vmax and subtracting Vmax when the amplitude is equal to or larger than the amplitude Vmax, the second relative position signal Inc2' can be generated, which is a signal of 160 periods for the overall length of the scale.

The Vernier signal Pv1 can be obtained by calculating a difference between the signal level V1inc1 of the first relative position signal Inc1 and the signal level V2inc2' of the second relative position signal Inc2', and by adding the amplitude Vmax when the difference has a negative value. Since a periodic difference is one for the overall length Lmax between the first relative position signal Inc and the second relative position signal Inc2', the Vernier signal Pv1 has a triangular wave of one period for the overall length Lmax as illustrated in FIG. 23D. If the Vernier signal Pv1 is calculated in the step S2205, the flow proceeds to the step S2206.

In the step S2206, the ABS calculating unit 102 calculates the Vernier signal Pv2 based on the signal level V2inc2 of the second relative position signal Inc2 at the execution timing T2 and the signal level V3inc3 of the third relative position signal Inc3 at the execution timing T3. The Vernier signal Pv2 calculated at this time is illustrated in FIG. 23E. The third relative position signal Inc3 is a signal of 37 periods for the overall length of the scale. Herein, by doubling the amplitude Vmax and by subtracting Vmax when the amplitude is equal to or larger than the amplitude Vmax, the third relative position signal Inc3' can be generated, which is a signal of 74 periods for the overall length of the scale.

The Vernier signal Pv2 is obtained by calculating a difference between the signal level V2inc2 of the second relative position signal Inc2 and the signal level V3inc3' of the third relative position signal Inc3', and by adding the amplitude Vmax when the difference has a negative value. Since the periodic difference is six for the overall length Lmax between the second relative position signal Inc2 and the third relative position signal Inc3', the Vernier signal Pv2 has a sawtooth wave of 6 periods for the overall length Lmax as illustrated in FIG. 23E. When the Vernier signal Pv2 is calculated in the step S2206, the flow proceeds to the step S2207.

In the step S2207, the ABS calculating unit 102 calculates the Vernier signal Pv3 based on the signal level V1inc1 of the first relative position signal Inc1 at the execution timing T1 and the signal level V3inc3 of the third relative position signal Inc3 at the execution timing T3. The Vernier signal Pv3 calculated at this time is illustrated in FIG. 23F. The third relative position signal Inc3 is a signal of 37 periods for the overall length of the scale. Here, by quadrupling the amplitude Vmax and by subtracting Vmax when the amplitude is equal to or larger than the amplitude Vmax, a third relative position signal Inc3" can be generated which is a signal of 148 periods for the overall length of the scale.

The Vernier signal Pv3 is obtained by calculating a difference between the signal level V1inc1 of the first relative position signal Inc1 and the signal level V3inc3" of the third relative position signal Inc3", and by adding the amplitude Vmax when the difference has a negative value. Here, since the periodic difference is thirteen for the overall length Lmax between the first relative position signal Inc1 and the third relative position signal Inc3", the Vernier signal Pv3 has a sawtooth wave of 13 periods for the overall length Lmax as illustrated in FIG. 23F. When the Vernier signal Pv3 is calculated in the step S2207, the flow proceeds to step S2208.

In the step S2208, the ABS calculating unit 102 calculates the absolute position Pabs. A detailed description will be given of a method of calculating the absolute position Pabs. Each of the first a-phase displacement signal S1rA, the first b-phase displacement signal S1rB, the second a-phase displacement signal S2rA, the second b-phase displacement signal S2rB, the third a-phase displacement signal S3rA, and the third b-phase displacement signal S3rB includes an error component. Hence, the first relative position signal Inc1, the second relative position signal Inc2, and the third relative position signal Inc3 calculated from these signals also contain error components. In order to correct (reduce) these error components, the ABS calculating unit 102 performs a synchronous calculation of the plurality of signals. Herein, the plurality of signals are the Vernier signal Pv1 that is the highest signal, the Vernier signal Pv2 that is a higher signal, the Vernier signal Pv3 that is a middle signal, the third relative position signal Inc3 that is a lower signal, and the first relative position signal Inc1 that is the lowest signal. The synchronization calculation of the plurality of signals is performed by synchronizing the higher signal and the lower signal with each other in order from the higher signal. The synchronization calculation method is similar to that of the first embodiment.

First, the ABS calculating unit 102 synchronizes the highest signal and the higher signal with each other. Next, the ABS calculating unit 102 synchronizes the higher signal and the middle signal with each other, the middle signal and the lower signal with each other, the lower signal and the lowest signal with each other, and calculates a combination signal as a signal Vabs indicating the absolute position. After calculating the absolute position Pabs at the execution timing T1 using the Vernier signals Pv1, Pv2, and Pv3, the third relative position signal Inc3, and the first relative position signal Inc1 in the step S2208, the flow proceeds to the step S2209 and ends. As described above, the absolute position Pabs can be calculated.

Next follows a description of a plurality of reliabilities Mgn1, Mgn2, Mgn3, and Mgn4. The reliability is calculated in a manner similar to that of the first embodiment. This embodiment performs four synchronizations between the highest signal and the higher signal, between the higher signal and the middle signal, between the middle signal and the lower signal, and between the lower signal and the lowest signal. Hence, the reliabilities Mgn1, Mgn2, Mgn3, and Mgn4 are calculated in each synchronization.

Figure 24:
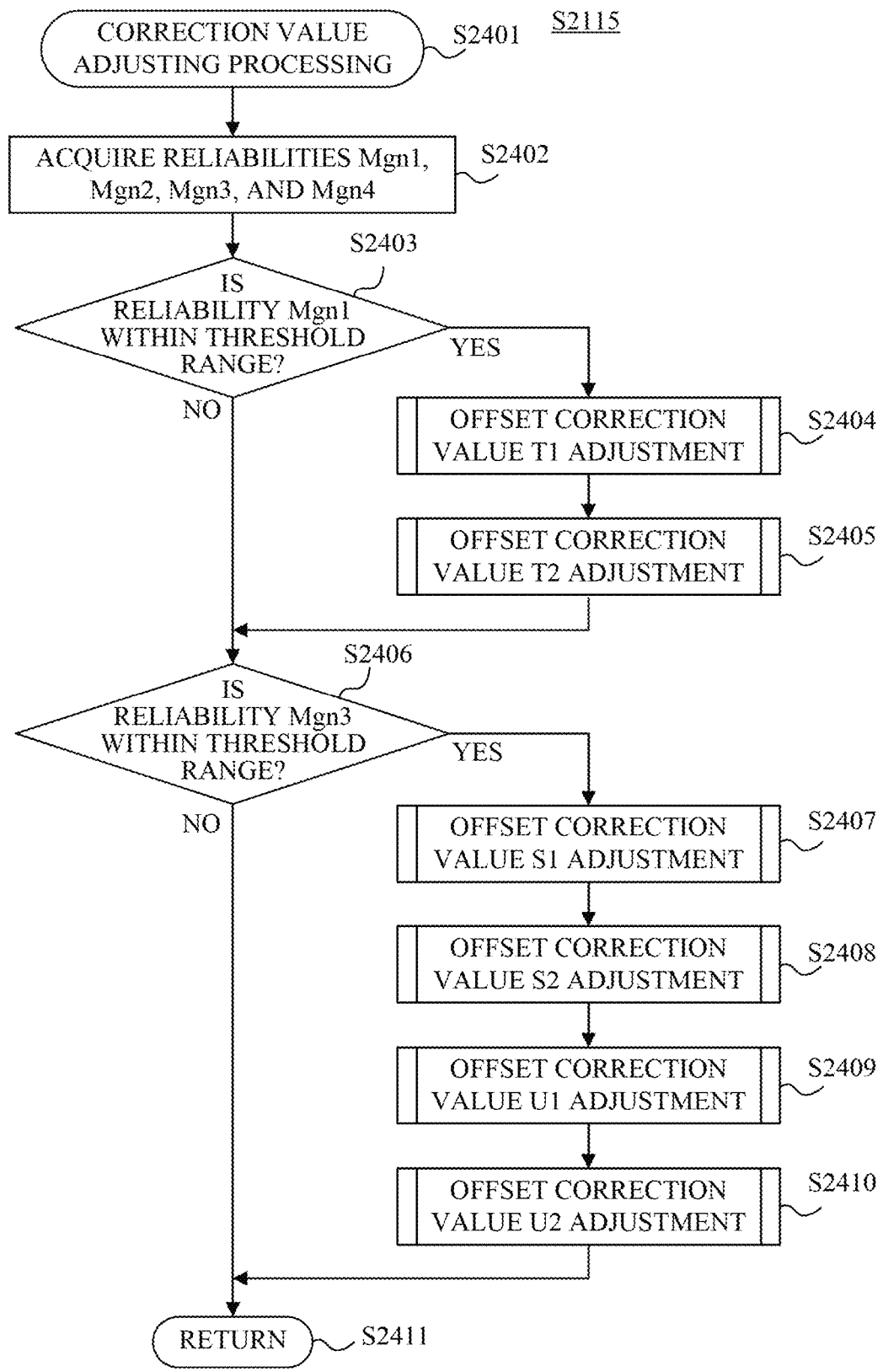
FIG. 24 is a flowchart of correction value adjusting processing according to the fourth embodiment.

Referring now to FIG. 24, a description will be given of correction value adjusting processing according to this embodiment. The correction value adjusting unit 109 adjusts the offset correction values S1 and S2 of the first a-phase displacement signal S1rA and the first b-phase displacement signal S1rB stored in the data storage 107. The correction value adjusting unit 109 adjusts the offset correction values T1 and T2 of the second a-phase displacement signal S2rA and the second b-phase displacement signal S2rB stored in the data storage 107. The correction value adjusting unit 109 adjusts the offset correction values U1 and U2 of the third a-phase displacement signal S3rA and the third b-phase displacement signal S3rB stored in the data storage 107.

FIG. 24 is a flowchart of the correction value adjusting processing (step S2115). Each step in FIG. 24 is executed by the correction value adjusting unit 109.

First, in the step S2401, the correction value adjusting processing starts. Next, in the step S2402, the correction value adjusting unit 109 acquires the reliabilities Mgn1, Mgn2, Mgn3, and Mgn4 stored in the data storage 107. Next, in the step S2403, the correction value adjusting unit 109 determines whether or not the reliability Mgn1 falls within a (first) threshold range. When the reliability Mgn1 is within the threshold range, the flow proceeds to the step S2404, and if not, the flow proceeds to the step S2406. In this embodiment, the threshold of the reliability Mgn1 is set to 0.1 (−0.1) and 0.3 (−0.3). Then, when the reliability Mgn1 is −0.3 or more and less than −0.1 or 0.1 or more and less than 0.3 (when the reliability Mgn1 falls within the threshold range), the correction value adjusting unit 109 determines that it is necessary to adjust the correction values T1 and T2, and starts adjusting the correction values.

A description will now be given of a reason why it can determine that the correction values T1 and T2 need to be adjusted based on the reliability Mgn1. The reliability Mgn1 is calculated in synchronizing the Vernier signal Pv1 that is the highest signal with the Vernier signal Pv2 that is the higher signal. The Vernier signal Pv1 is a signal generated from the first relative position signal Inc1 and the second relative position signal Inc2. The Vernier signal Pv2 that is the higher signal is a signal generated from the second relative position signal Inc2 and the second relative position signal Inc3. In other words, both the highest signal and the higher signal are calculated based on the second relative position signal Inc2.

The second relative position signal Inc2 is calculated from the second a-phase displacement signal S2rA and the second b-phase displacement signal S2rB. If the offset correction values T1 and T2 shift from the offsets t1 and t2, respectively, the second relative position signal Inc2 comes to contain an error. This error becomes an error in synchronizing the highest signal with the higher signal from the above relationship, and the reliability Mgn1 lowers. For the same reason, an error occurs when the higher signal and the middle signal are synchronized with each other, and the reliability Mgn2 lowers. However, since the Vernier signal Pv3 is not a signal calculated based on the second relative position signal Inc2, the influence on the reliability Mgn2 is smaller than the reliability Mgn1. As discussed, it can be determined that the correction values T1 and T2 need to be adjusted based on the reliability Mgn1.

In the step S2404, the correction value adjusting unit 109 adjusts the offset correction value T1 of the second a-phase displacement signal S2rA. The adjustment of the offset correction value T1 will be described in detail later. Next, in the step S2405, the correction value adjusting unit 109 adjusts the offset correction value T2 of the second b-phase displacement signal S2rB. Next, in the step S2406, the correction value adjusting unit 109 determines whether or not the reliability Mgn3 falls within a (second) threshold range. If the reliability Mgn3 is within the threshold range, the flow proceeds to the step S2407. On the other hand, if the reliability Mgn3 is located out of the threshold range, the flow proceeds to the step S2409. In this embodiment, when the reliability Mgn3 is −0.3 or more and −0.1 or less, or 0.1 or more and 0.3 or less (or when the reliability Mgn3 falls within the threshold range), the correction value adjusting unit 109 determines that it is necessary to adjust the correction values S1, S2, U1, and U2, and starts adjusting each correction value.

The reliability Mgn3 is calculated when the Vernier signal Pv3 that is the middle signal, and the third relative position signal Inc3 that is the lower signal are synchronized with each other. The Vernier signal Pv3 is a signal generated from the first relative position signal Inc1 and the third relative position signal Inc3. In other words, both the middle signal and the lower signal are calculated based on the third relative position signal Inc3. Hence, it is possible to determine that the correction values U1 and U2 need to be adjusted based on the reliability Mgn3, similar to the reason why it can be determined based on the reliability Mgn1 that the correction values T1 and T2 need to be adjusted.

When the Vernier signal Pv3 is generated, the first relative position signal Inc1 is used at the same magnification, and the third relative position signal Inc3 is used in quadruple. Hence, the Vernier signal Pv3 is particularly susceptible to the error of the first relative position signal Inc1. In other words, the reliabilities Mgn2 and Mgn3 calculated in synchronizing the Vernier signal Pv3 are particularly susceptible to the error of the first relative position signal Inc1. The reliability Mgn3 is particularly affected by the third relative position signal Inc3 for the above reason. The reliability Mgn3 is particularly likely to be lower than the reliability Mgn2. It can be determined based on the reliability Mgn3 that the correction values S1 and S2 need to be adjusted.

In the step S2407, the correction value adjusting unit 109 adjusts the offset correction value S1 of the first a-phase displacement signal S1rA. Next, in the step S2408, the correction value adjusting unit 109 adjusts the offset correction value S2 of the first b-phase displacement signal S1rB. Next, in the step S2409, the correction value adjusting unit 109 adjusts the offset correction value U1 of the third a-phase displacement signal S3rA. Next, in the step S2410, the correction value adjusting unit 109 adjusts the offset correction value U2 of the third b-phase displacement signal S3rB. Then, the flow proceeds to the step S2411 and ends.

Figure 25:
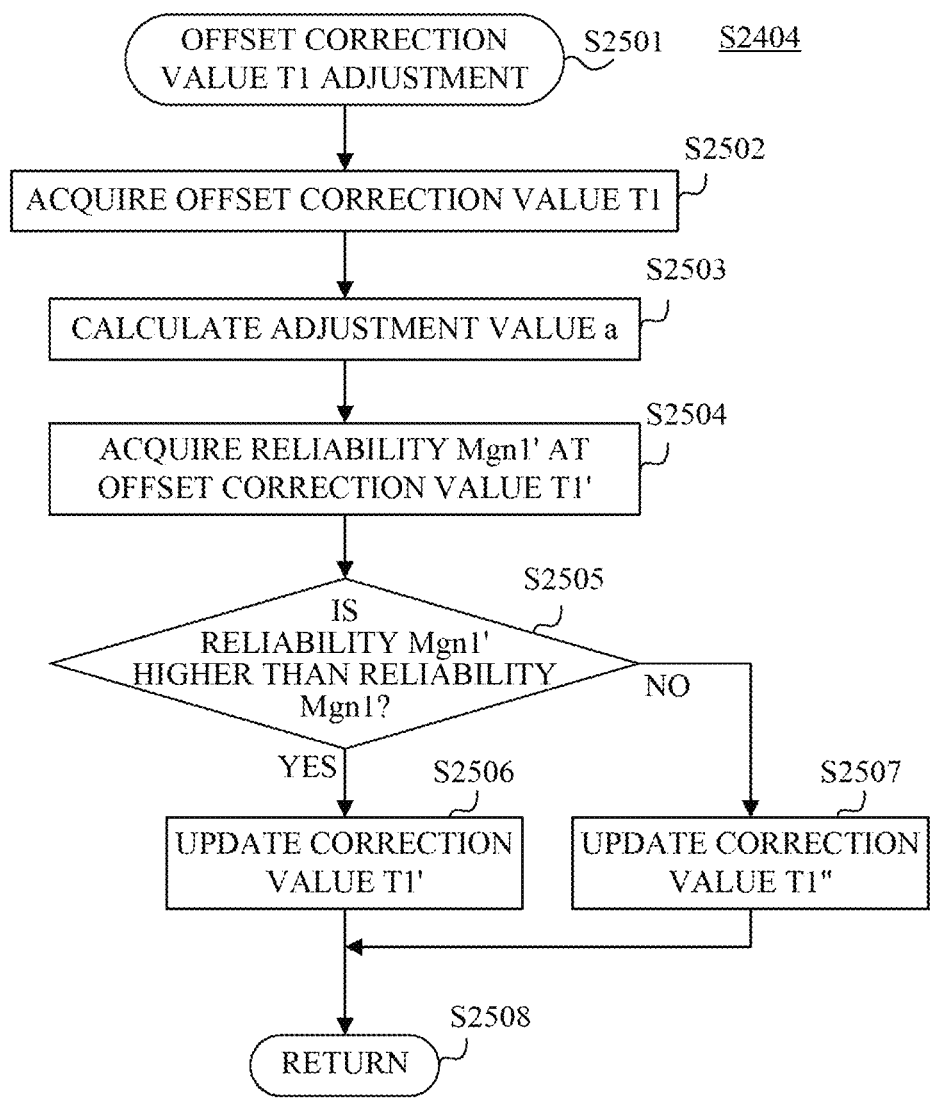
FIG. 25 is a flowchart of offset correction value adjusting processing according to the fourth embodiment.

Referring now to FIG. 25, a description will be given of the offset correction value T1 adjustment (step S2404) according to this embodiment. In addition, since the same processing is performed for the adjustment of offset correction value S1, S2, T2, U1, and U2, a description thereof will be omitted.

FIG. 25 is a flowchart of the offset correction value T1 adjustment. Each step in FIG. 25 is executed by the correction value adjusting unit 109. First, in the step S2501, this processing starts. Next, in the step S2502, the correction value adjusting unit 109 acquires the offset correction value T1 stored in the data storage 107.

Next, in the step S2503, the correction value adjusting unit 109 calculates an adjustment value a. The method for calculating the adjustment value a is the same as that of the first embodiment. Next, in the step S2504, the correction value adjusting unit 109 acquires the reliability Mgn1' at the offset correction value T1' obtained by changing the offset correction value T1 by the adjustment value a. When the offset correction value T1 is changed, the reliabilities Mgn1 and Mgn2 change. Thus, the reliability Mgn1 is likely to be lower than the reliability Mgn2. The reliability Mgn1 is the most suitable among all reliabilities for adjusting the offset correction value T1, and may be used.

Next, in the step S2505, the correction value adjusting unit 109 compares the reliability Mgn1 and the reliability Mgn1' with each other. When the reliability Mgn1' is higher than the reliability Mgn1, the flow proceeds to step S2506. On the other hand, when the reliability Mgn1' is lower than the reliability Mgn, the flow proceeds to the step S2507.

In the step S2506, the correction value adjusting unit 109 updates the offset correction value T1 stored in the data storage 107 to the offset correction value T1', proceeds to the step S2508, and ends this flow. In the step S2507, the correction value adjusting unit 109 updates the offset correction value T1 stored in the data storage 107 to the offset correction value T1'', proceeds to the step S2508, and ends this flow. This embodiment can adjust the correction value more efficiently and with high accuracy by using the plurality of reliabilities.

Each of the above embodiments has discussed the influence of dust as an example of the factor that decreases the reliability Mgn. However, the present invention is not limited to this embodiment and is applicable to all adversary effects that lead to abnormal absolute position calculations, such as scale scratches, external forces, other distortion of the scale and sensor, and characteristic changes due to the temperature.

Fifth Embodiment

Figure 26:
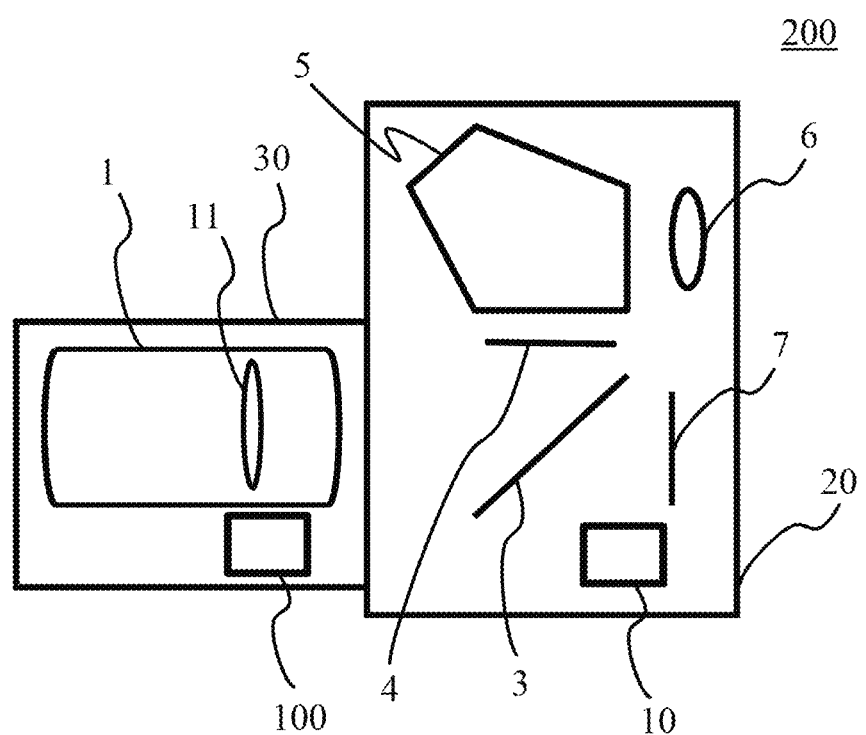
FIG. 26 is a configuration diagram of an imaging apparatus according to a fifth embodiment.

Referring now to FIG. 26, a description will be given of an imaging apparatus including the position detecting apparatus 100 according to each of the above embodiments. FIG. 26 is a configuration diagram of an imaging apparatus 200 (single-lens reflex camera). In FIG. 26, an interchangeable lens (lens apparatus) 30 includes an imaging optical system 1 including a lens (optical element) 11. The interchangeable lens 30 has a position detecting apparatus 100 that detects the position of the lens 11 (the position of the object).

A camera body (imaging apparatus body) 20 includes a quick return mirror 3, a focus screen 4, a penta dach prism 5, an eyepiece lens 6, and the like. The quick return mirror 3 upwardly reflects a light beam formed via the imaging optical system 1. The focus screen 4 is disposed at an imaging position of the imaging optical system 1. The penta dach prism 5 converts a reverse image formed on the focus screen 4 into an erect image. The user can observe the erect image through the eyepiece lens 6. An image sensor 7 includes a CCD sensor and a CMOS sensor, and photoelectrically converts an optical image (subject image) formed via the imaging optical system 1 and outputs image data. In capturing an image, the quick return mirror 3 is retracted from the optical path, and the optical image is formed on the image sensor 7 via the imaging optical system 1. The camera control unit 10 has a CPU and controls the operation of each component in the imaging apparatus 200.

The imaging apparatus 200 includes the camera body 20 having the image sensor 7 and the interchangeable lens 30 that is detachably attached to the camera body 20, but is not limited to this embodiment. In an imaging apparatus the camera body and the lens apparatus may be integrated with each other, or a single-lens non-reflex camera (mirrorless camera) having no quick return mirror may be used.

Thus, in each embodiment, the position detecting apparatus 100 includes the signal detecting unit (ABS sensor 104), the correction unit 106, the ABS calculating unit 102, the reliability calculating unit 108, and the correction value adjusting unit 109. The signal detecting unit detects a plurality of periodic signals (S1rA, S1rB, S2rA, S2rB, S3rA, S3rB) relating to the position of the object. The correction unit corrects a plurality of periodic signals using the correction values (amplitude correction values A1, A2, B1, B2, C1, C2 and offset correction values S1, S2, T1, T2, U1, U2), and generates a plurality of correction signals (S1cA, S1cB, S2cA, S2cB, S3cA, S3cB). The ABS calculating unit 102 generates a plurality of displacement signals (Inc1, Inc2, Inc3, Pv1, Pv2, Pv3) based on the plurality of correction signals, and calculates a position (absolute position of the object) based on the plurality of displacement signals. The reliability calculating unit calculates the reliability (Mgn) based on the plurality of displacement signals. The correction value adjusting unit adjusts the correction value based on the reliability.

The object may be movable member (movable elements 21, 191), and the plurality of periodic signals indicate the position of the movable member relative to the fixed member (fixed elements 22, 192). The correction unit corrects offsets of a plurality of periodic signals using the correction value (offset correction values S1, S2, T1, T2, U1, and U2). The correction unit may correct amplitudes of a plurality of periodic signals using the correction value (amplitude correction values A1, A2, B1, B2, C1, and C2).

The reliability calculating unit may calculate the first reliability (Mgn1) corresponding to the first correction value (such as the offset correction value S1) and the second reliability (Mgn') corresponding to the second correction value (such as the offset correction value S1'). The correction value adjusting unit may change the first correction value to the second correction value when the second reliability is higher than the first reliability. The correction value adjusting unit may not change the first correction value to the second correction value when the second reliability is lower than the first reliability. When the second reliability is lower than the first reliability, the correction value adjusting unit may change the first correction value to a third correction value (such as the offset correction value S1") different from the second correction value. The second correction value may be larger than the first correction value, and the third correction value may be smaller than the first correction value. Alternatively, the second correction value may be smaller than the first correction value, and the third correction value may be larger than the first correction value.

When the first reliability is higher than the predetermined reliability, the correction value adjusting unit may reduce each of a difference between the first correction value and the second correction value, and a difference (adjustment value a) between the first correction value and the third correction value. On the other hand, when the first reliability is lower than the predetermined reliability, the correction value adjusting unit increases each of a difference between the first correction value and the second correction value, and a difference (adjustment value a) between the first correction value and the third correction value.

The reliability calculating unit may calculate a first reliability corresponding to the first correction value and a plurality of reliabilities corresponding to a plurality of correction values different from the first correction value. Then, the correction value adjusting unit may change the first correction value to the second correction value selected from among the plurality of correction values (such as a correction value having the highest reliability among the plurality of reliabilities). The second reliability corresponding to the second correction value may be higher than the first reliability.

The reliability calculating unit may calculate the first reliability corresponding to the first correction value and the second reliability corresponding to the second correction value. The correction value adjusting unit may predict a third correction value having a third reliability higher than the first reliability based on the first reliability and the second reliability, and change the first correction value to the third correction value (see FIG. 18). The correction value adjusting unit may adjust the correction value when the correction value falls within a predetermined range, and may not adjust the correction value when the correction value is located outside the predetermined range (see FIG. 13).

The correction unit may correct each of the plurality of periodic signals based on the plurality of correction values. In addition, the reliability calculating unit may calculate the plurality of reliabilities (Mgn1 to Mgn4). The correction value adjusting unit may adjust at least one correction value selected from the plurality of correction values based on the plurality of reliabilities.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Each embodiment can provide a position detecting apparatus, a lens apparatus, a position detecting method, and a storage medium that can inexpensively maintain the detection accuracy of the position of an object.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-203152, filed on Oct. 29, 2018, which is hereby incorporated by reference herein in its entirety.

What is claimed is:

1. A position detecting apparatus comprising:
a signal detecting unit configured to detect a plurality of periodic signals relating to a position of an object;
a correction unit configured to correct the plurality of periodic signals using a correction value to generate a plurality of correction signals;
a first calculating unit configured to generate a plurality of displacement signals based on the plurality of correction signals and to calculate the position based on the plurality of displacement signals;
a second calculating unit configured to calculate a reliability based on the plurality of displacement signals; and
a correction value adjusting unit configured to adjust the correction value based on the reliability,
wherein the second calculating unit calculates a first reliability corresponding to a first correction value and a second reliability corresponding to a second correction value, and
wherein the correction value adjusting unit changes the first correction value to the second correction value when the second reliability is higher than the first reliability.

2. The position detecting apparatus according to claim 1, wherein the object is a movable member, and the plurality of periodic signals indicate a position of the movable member relative to a fixed member.

3. The position detecting apparatus according to claim 1, wherein the correction unit corrects offsets of the plurality of periodic signals using the correction value.

4. The position detecting apparatus according to claim 1, wherein the correction unit corrects amplitudes of the plurality of periodic signals using the correction value.

5. The position detecting apparatus according to claim 1, wherein the correction value adjusting unit does not change the first correction value to the second correction value when the second reliability is lower than the first reliability.

6. The position detecting apparatus according to claim 1, wherein the correction value adjusting unit changes the first correction value to a third correction value different from the second correction value when the second reliability is lower than the first reliability.

7. The position detecting apparatus according to claim 6, wherein the second correction value is larger than the first correction value, and the third correction value is smaller than the first correction value.

8. The position detecting apparatus according to claim 6, wherein the second correction value is smaller than the first correction value, and the third correction value is larger than the first correction value.

9. The position detecting apparatus according to claim 6, wherein the correction value adjusting unit decreases each of a difference between the first correction value and the second correction value and a difference between the first correction value and the third correction value, when the first reliability is higher than a predetermined reliability, and
wherein the correction value adjusting unit increases each of the difference between the first correction value and the second correction value and the difference between the first correction value and the third correction value, when the first reliability is lower than the predetermined reliability.

10. The position detecting apparatus according to claim 1, wherein the second calculating unit calculates the first reliability corresponding to the first correction value and a plurality of reliabilities corresponding to a plurality of correction values different from the first correction value, and
wherein the correction value adjusting unit changes the first correction value to the second correction value selected from among the plurality of correction values.

11. The position detecting apparatus according to claim 10, wherein the second reliability corresponding to the second correction value is higher than the first reliability.

12. The position detecting apparatus according to claim 1, wherein the second calculating unit calculates the first reliability corresponding to the first correction value and the second reliability corresponding to the second correction value, and
wherein the correction value adjusting unit predicts a third correction value having a third reliability higher than the first reliability based on the first reliability and the second reliability, and changes the first correction value to the third correction value.

13. The position detecting apparatus according to claim 1, wherein the correction value adjusting unit adjusts the correction value if the correction value is within a predetermined threshold range, and does not adjust the correction value if the correction value is outside the predetermined threshold range.

14. The position detecting apparatus according to claim 1, wherein the correction unit corrects the plurality of periodic signals based on a plurality of correction values,
wherein the second calculating unit calculates a plurality of reliabilities, and
wherein the correction value adjusting unit adjusts at least one correction value selected from among the plurality of correction values based on the plurality of reliabilities.

15. A lens apparatus comprising:
an optical element; and
a position detecting apparatus configured to detect a position of the optical element,
wherein the position detecting unit includes:
a signal detecting unit configured to detect a plurality of periodic signals relating to a position of an object;
a correction unit configured to correct the plurality of periodic signals using a correction value to generate a plurality of correction signals;
a first calculating unit configured to generate a plurality of displacement signals based on the plurality of correction signals and to calculate the position based on the plurality of displacement signals;

a second calculating unit configured to calculate a reliability based on the plurality of displacement signals; and
a correction value adjusting unit configured to adjust the correction value based on the reliability,
wherein the second calculating unit calculates a first reliability corresponding to a first correction value and a second reliability corresponding to a second correction value, and
wherein the correction value adjusting unit changes the first correction value to the second correction value when the second reliability is higher than the first reliability.

16. A position detecting method comprising the steps of:
detecting a plurality of periodic signals relating to a position of an object;
correcting the plurality of periodic signals using a correction value to generate a plurality of correction signals;
generating a plurality of displacement signals based on the plurality of correction signals and calculating the position based on the plurality of displacement signals;
calculating a reliability based on the plurality of displacement signals; and
adjusting the correction value based on the reliability,
wherein the step of calculating the reliability calculates a first reliability corresponding to a first correction value and a second reliability corresponding to a second correction value, and
wherein the step of adjusting the correction value changes the first correction value to the second correction value when the second reliability is higher than the first reliability.

17. A non-transitory computer-readable storage medium storing a program for causing a computer to execute the position detecting method according to claim 16.

* * * * *